(12) United States Patent  
Beon et al.

(10) Patent No.: US 12,439,800 B2  
(45) Date of Patent: Oct. 7, 2025

(54) DISPLAY PANEL AND DISPLAY DEVICE INCLUDING THE SAME

(71) Applicant: Samsung Display Co., LTD., Yongin-si (KR)

(72) Inventors: Beonghun Beon, Yongin-si (KR); Woosuk Jung, Yongin-si (KR); Minha Kim, Yongin-si (KR); Sunhwa Kim, Yongin-si (KR); Jeseon Yeon, Yongin-si (KR); Kwanhee Lee, Yongin-si (KR); Dukjin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 197 days.

(21) Appl. No.: 17/030,223

(22) Filed: Sep. 23, 2020

(65) Prior Publication Data

US 2021/0280825 A1  Sep. 9, 2021

(30) Foreign Application Priority Data

Mar. 5, 2020  (KR) .................. 10-2020-0027978

(51) Int. Cl.
  *H10K 59/60*  (2023.01)
  *H10K 50/80*  (2023.01)
  (Continued)

(52) U.S. Cl.
  CPC .......... *H10K 59/60* (2023.02); *H10K 50/844* (2023.02); *H10K 50/868* (2023.02); *H10K 59/65* (2023.02);
  (Continued)

(58) Field of Classification Search
  CPC .. H01L 51/5253–5256; H01L 51/5293; H10K 50/844; H10K 50/868; H10K 50/85;
  (Continued)

(56) References Cited

U.S. PATENT DOCUMENTS

| | | |
|---|---|---|
| 5,974,150 A | 10/1999 | Kaish et al. |
| 6,716,294 B1 | 4/2004 | Vetrini |

(Continued)

FOREIGN PATENT DOCUMENTS

| | | |
|---|---|---|
| CN | 107946341 | 4/2018 |
| CN | 110061038 | 7/2019 |

(Continued)

OTHER PUBLICATIONS

European Search Report dated Jul. 9, 2021, issued to European Patent Application No. 21160452.5.

*Primary Examiner* — Shaun M Campbell  
(74) *Attorney, Agent, or Firm* — Womble Bond Dickinson (US) LLP

(57) ABSTRACT

A display panel including a main display area and a component area having an auxiliary display area and a transmission area, a substrate, a plurality of main display elements arranged on the substrate in the main display area, and a plurality of main pixel circuits respectively connected to the main display elements, a plurality of auxiliary display elements arranged on the substrate in the auxiliary display area, and a plurality of auxiliary pixel circuits respectively connected to the auxiliary display elements, and an optical functional layer including a polarization area corresponding to the main display area and the auxiliary display area, and a non-polarization area corresponding to the transmission area.

18 Claims, 19 Drawing Sheets

(51) Int. Cl.
*H10K 50/844* (2023.01)
*H10K 59/65* (2023.01)
*H10K 59/80* (2023.01)

(52) U.S. Cl.
CPC ..... *H10K 59/8731* (2023.02); *H10K 59/8791* (2023.02)

(58) Field of Classification Search
CPC .......... H10K 59/126; H10K 59/12165; H10K 59/353; H10K 59/60; H10K 59/122; H10K 59/1213; H10K 59/123; H10K 59/124; H10K 59/131; H10K 59/00; H10K 59/12
See application file for complete search history.

(56) References Cited

U.S. PATENT DOCUMENTS

| | | | |
|---|---|---|---|
| 7,061,617 | B2 | 6/2006 | Querleux et al. |
| 9,291,744 | B2 | 3/2016 | Sawada et al. |
| 10,215,900 | B2 | 2/2019 | Yaegashi et al. |
| 10,215,903 | B2 | 2/2019 | Lee et al. |
| 10,234,611 | B2 | 3/2019 | Goto et al. |
| 10,359,553 | B2 | 7/2019 | Lee et al. |
| 10,436,962 | B2 | 10/2019 | Lee et al. |
| 11,048,306 | B2 | 6/2021 | Kwak et al. |
| 2012/0106063 | A1 | 5/2012 | Mathew et al. |
| 2015/0082553 | A1 | 3/2015 | Landa et al. |
| 2016/0005803 | A1* | 1/2016 | Ryu ............... H01L 27/3248 257/40 |
| 2016/0025910 | A1 | 1/2016 | Sawada et al. |
| 2017/0090085 | A1 | 3/2017 | Goto et al. |
| 2017/0090087 | A1 | 3/2017 | Goto et al. |
| 2017/0129197 | A1 | 5/2017 | Yaegashi et al. |
| 2017/0131451 | A1 | 5/2017 | Yaegashi et al. |
| 2017/0254939 | A1 | 9/2017 | Lee et al. |
| 2018/0089485 | A1 | 3/2018 | Bok |
| 2018/0173050 | A1 | 6/2018 | Yaegashi et al. |
| 2018/0315357 | A1* | 11/2018 | Nam ............... H01L 27/3223 |
| 2019/0088684 | A1 | 3/2019 | Yu et al. |
| 2019/0212788 | A1 | 7/2019 | Kwak et al. |
| 2019/0220122 | A1* | 7/2019 | Shin ............... G06F 3/041 |
| 2019/0278132 | A1 | 9/2019 | Nakamura et al. |
| 2021/0143364 | A1* | 5/2021 | Jin ............... H01L 51/5234 |
| 2021/0193756 | A1* | 6/2021 | Oh ............... H01L 27/3218 |
| 2021/0233988 | A1* | 7/2021 | Wei ............... G09G 3/3233 |
| 2021/0265596 | A1* | 8/2021 | Lou ............... H01L 51/5253 |
| 2021/0336233 | A1* | 10/2021 | Shen ............... H01L 27/3232 |
| 2021/0408148 | A1* | 12/2021 | Wang ............... H01L 27/3234 |

FOREIGN PATENT DOCUMENTS

| | | | |
|---|---|---|---|
| CN | 110061038 A * | 7/2019 | ............ H01L 51/00 |
| CN | 110444125 | 11/2019 | |
| CN | 110783370 A | 2/2020 | |
| EP | 3508960 | 7/2019 | |
| JP | 6296905 | 5/1987 | |
| JP | 63265203 | 11/1988 | |
| JP | 02504434 | 12/1990 | |
| JP | 2001-518414 | 10/2001 | |
| JP | 2003-157711 | 5/2003 | |
| JP | 2003-279742 | 10/2003 | |
| JP | 2004-163405 | 6/2004 | |
| JP | 3744795 | 2/2006 | |
| JP | 5244848 | 7/2013 | |
| JP | 5288574 | 9/2013 | |
| JP | 2014-081482 | 5/2014 | |
| JP | 2014-164084 | 9/2014 | |
| JP | 2014-164085 | 9/2014 | |
| JP | 2014-167547 | 9/2014 | |
| JP | 2014-167548 | 9/2014 | |
| JP | 2014-191050 | 10/2014 | |
| JP | 2014-191051 | 10/2014 | |
| JP | 5774349 | 9/2015 | |
| JP | 2016-027393 | 2/2016 | |
| JP | 2016-053645 | 4/2016 | |
| JP | 2016-538599 | 12/2016 | |
| JP | 2017-503193 | 1/2017 | |
| JP | 6176947 | 8/2017 | |
| JP | 6215261 | 10/2017 | |
| JP | 6215262 | 10/2017 | |
| JP | 2018-010322 | 1/2018 | |
| JP | 2018-018106 | 2/2018 | |
| JP | 2018-045042 | 3/2018 | |
| JP | 2018-088004 | 6/2018 | |
| JP | 2018-088005 | 6/2018 | |
| JP | 6336075 | 6/2018 | |
| JP | 6351559 | 7/2018 | |
| JP | 6366712 | 8/2018 | |
| JP | 6401377 | 10/2018 | |
| JP | 6412476 | 10/2018 | |
| JP | 6422415 | 11/2018 | |
| JP | 6434020 | 12/2018 | |
| JP | 6450545 | 1/2019 | |
| JP | 2019-144600 | 8/2019 | |
| JP | 6562560 | 8/2019 | |
| JP | 2019-158956 | 9/2019 | |
| KR | 10-1997-0050332 | 4/1999 | |
| KR | 10-0587497 | 6/2006 | |
| KR | 10-0648183 | 11/2006 | |
| KR | 10-2010-0023998 | 3/2010 | |
| KR | 10-2010-0087837 | 8/2010 | |
| KR | 10-0980763 | 9/2010 | |
| KR | 10-2010-0125537 | 12/2010 | |
| KR | 10-2010-0125558 | 12/2010 | |
| KR | 10-2010-0125560 | 12/2010 | |
| KR | 10-2011-0110889 | 10/2011 | |
| KR | 10-1197370 | 11/2012 | |
| KR | 10-2014-0027952 | 3/2014 | |
| KR | 10-1488063 | 1/2015 | |
| KR | 10-2015-0066428 A | 6/2015 | |
| KR | 10-2015-0086159 | 7/2015 | |
| KR | 10-2015-0111878 | 10/2015 | |
| KR | 10-2015-0111879 | 10/2015 | |
| KR | 10-1706863 | 2/2017 | |
| KR | 10-1707055 | 2/2017 | |
| KR | 10-2017-0037853 | 4/2017 | |
| KR | 10-2017-0037854 | 4/2017 | |
| KR | 10-2017-0037855 | 4/2017 | |
| KR | 10-2017-0062896 A | 6/2017 | |
| KR | 10-2017-0083995 | 7/2017 | |
| KR | 10-1766015 | 8/2017 | |
| KR | 10-2017-0122167 | 11/2017 | |
| KR | 10-2018-0011239 A | 1/2018 | |
| KR | 10-1827074 | 2/2018 | |
| KR | 10-2018-0033361 A | 4/2018 | |
| KR | 10-1848987 | 4/2018 | |
| KR | 10-1953171 | 2/2019 | |
| KR | 10-1964602 | 4/2019 | |
| KR | 10-1964604 | 4/2019 | |
| KR | 10-2019-0084397 A | 7/2019 | |
| KR | 10-2002369 | 7/2019 | |
| KR | 10-2003367 | 7/2019 | |
| KR | 10-2003632 | 7/2019 | |

* cited by examiner

DISPLAY PANEL AND DISPLAY DEVICE INCLUDING THE SAME

CROSS-REFERENCE TO RELATED APPLICATION

This application claims priority from and the benefit of Korean Patent Application No. 10-2020-0027978, filed on Mar. 5, 2020, which is hereby incorporated by reference for all purposes as if fully set forth herein.

BACKGROUND

Field

Exemplary embodiments of the invention relate generally to a display panel and a display device including the same, and more particularly, to a display panel capable of expanding a display area to display images in an area where an electronic component is located, and a display device including the display panel.

Discussion of the Background

Recently, display apparatuses have been used in various fields. Also, as the thickness and weight of display apparatuses have been reduced, the range of the usage of the display apparatuses has widened.

The above information disclosed in this Background section is only for understanding of the background of the inventive concepts, and, therefore, it may contain information that does not constitute prior art.

SUMMARY

Display panels constructed according to exemplary embodiments of the invention are capable of being expanded to display images in an area where an electrical component is located, and a display device including the same.

Additional features of the inventive concepts will be set forth in the description which follows, and in part will be apparent from the description, or may be learned by practice of the inventive concepts.

A display panel according to an exemplary embodiment includes a main display area and a component area, the component area including an auxiliary display area and a transmission area, a substrate, a plurality of main display elements arranged on the substrate in the main display area, and a plurality of main pixel circuits respectively connected to the main display elements, a plurality of auxiliary display elements arranged on the substrate in the auxiliary display area, and a plurality of auxiliary pixel circuits respectively connected to the auxiliary display elements, and an optical functional layer including a polarization area corresponding to the main display area and the auxiliary display area, and a non-polarization area corresponding to the transmission area.

In the component area, the non-polarization area may surround at least some portions of the auxiliary display area.

The non-polarization area may have a greater light transmittance than the polarization area.

An upper surface of the optical functional layer may be substantially flat throughout the non-polarization area and the polarization area.

The optical functional layer in the polarization area may include a material different from the optical functional layer in the non-polarization area.

The display panel may further include an opposite electrode commonly included in the main display elements and the auxiliary display elements, in which the opposite electrode may include a through hole corresponding to the transmission area.

The display panel may further include a bottom metal layer disposed between the substrate and the auxiliary pixel circuits.

The substrate may include a first base layer, a first inorganic barrier layer, a second base layer, and a second inorganic barrier layer sequentially stacked one over another, the second inorganic barrier layer may include a first opening corresponding to the transmission area, and the second base layer may include a second opening overlapping the first opening, and the substrate may further include a groove formed by the first opening, the second opening, and an upper surface of the first inorganic barrier layer.

The display panel may further include an encapsulation member disposed on the main display elements and the auxiliary display elements, and an optical clear adhesive disposed between the optical functional layer and the encapsulation member.

The optical functional layer may include a polarization layer and a retardation layer.

A display device according to another exemplary embodiment includes a display panel having a main display area and a component area, the component area including an auxiliary display area and a transmission area, a cover window disposed on the display panel, and a component disposed under the display panel to correspond to the component area, in which the display panel includes an optical functional layer including a polarization area corresponding to the main display area and the auxiliary display area, and a non-polarization area corresponding to the transmission area.

The display device may further include an optical clear adhesive disposed between the optical functional layer and the cover window.

In the component area, the non-polarization area may surround at least some portions of the auxiliary display area.

The component may overlap at least some portions of the auxiliary display area.

The non-polarization area may have a greater light transmittance than the polarization area.

An upper surface of the optical functional layer may be substantially flat throughout the non-polarization area and the polarization area.

The optical functional layer in the polarization area may include a material different from the optical functional layer in the non-polarization area.

The optical functional layer may include a polarization layer and a retardation layer.

The display panel may include a substrate, a plurality of main display elements arranged on the substrate to correspond to the main display area, and a plurality of main pixel circuits respectively connected to the main display elements, a plurality of auxiliary display elements arranged on the substrate to correspond to the auxiliary display area, and a plurality of auxiliary pixel circuits respectively connected to the auxiliary display elements, in which the auxiliary display elements include an opposite electrode including a through hole that corresponds to the transmission area.

The substrate may include a groove corresponding to the transmission area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
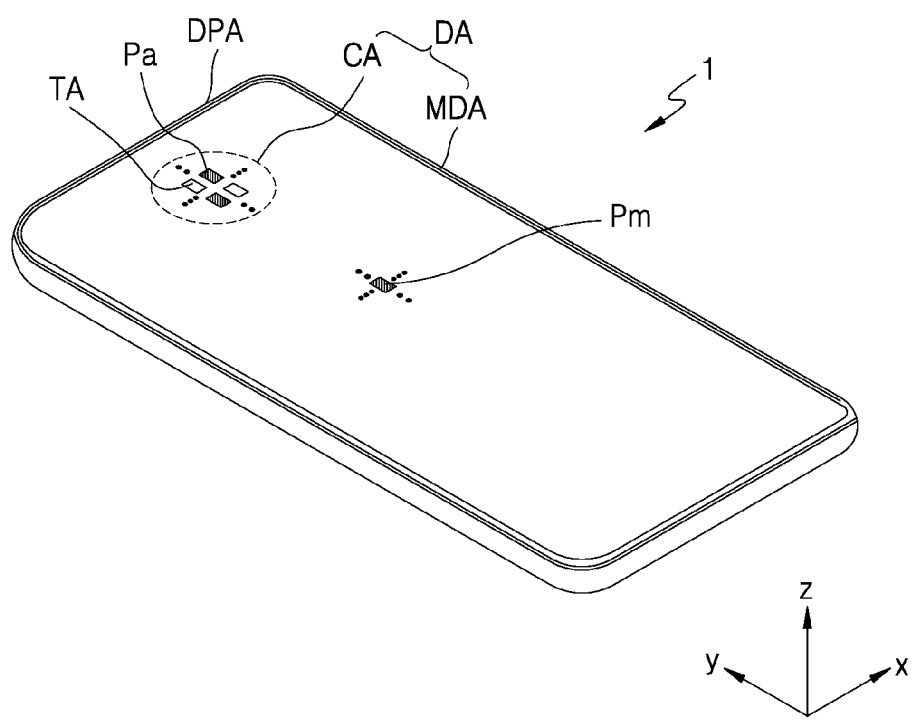
FIG. 1 is a schematic perspective view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic perspective view of a display device 1 according to an exemplary embodiment.

Referring to FIG. 1, the display device 1 includes a display area DA and a display peripheral area DPA outside the display area DA. The display area DA includes a component area CA and a main display area MDA surrounding at least a portion of the component area CA. The component area CA and the main display area MDA may display images separately or together. The display peripheral area DPA may be a non-display area where display elements are not arranged. The display area DA may be surrounded by the display peripheral area DPA.

FIG. 1 exemplarily shows that one component area CA is located within the main display area MDA. In another exemplary embodiment, the display device 1 may include two or more component areas CA, and shapes and sizes of the component areas CA may be different from each other. When viewed in a direction perpendicular to an upper surface of the display device 1, the shape of the component area CA may be a circle, an oval, a polygon such as a rectangle, a star, a diamond, or the like. FIG. 1 shows that, when viewed in the direction perpendicular to the upper surface of the display device 1, the component area CA is disposed at the upper center of the main display area MDA (+y direction) having a rectangular shape, but the inventive concept are not limited thereto. In some exemplary embodiments, the component area CA may be formed on one side of the main display area MDA that has a rectangular shape, for example, on an upper right side or an upper left side.

The display device 1 may provide images by using a plurality of main sub-pixels Pm, which are disposed in the main display area MDA, and a plurality of auxiliary sub-pixels Pa disposed in the component area CA.

As will be described below with reference to FIG. 2, in the component area CA, a component 40 such as an electronic component may be disposed under the display panel, corresponding to the component area CA. The component 40 may be a camera using infrared rays, visible rays, or the like, and may include an image device. Alternatively, the component 40 may be a solar cell, a flash, an illuminance sensor, a proximity sensor, or an iris sensor. In some exemplary embodiments, the component 40 may be capable of receiving sound. The component area CA may include a transmission area TA through which light, sound, and/or the like may be emitted to the outside from the component 40, or through which light, sound, and/or the like may be directed to the component 40 from the outside. In the display device according to an exemplary embodiment, when the display panel includes the component area CA, light transmittance thereof may be equal to or greater than about 10%, more preferably about 25%, about 40%, about 50%, 85%, or 90%.

In the component area CA, the auxiliary sub-pixels Pa may be arranged. The auxiliary sub-pixels Pa may emit light and provide a certain image. An image displayed in the component area CA is an auxiliary image, and may have a lower resolution than an image displayed in the main display area MDA. The component area CA includes the transmission area TA where light and sound may penetrate. When no sub-pixels are arranged in the transmission area TA according to an exemplary embodiment, the number of auxiliary sub-pixels Pa arranged per unit area may be less than the number of main sub-pixels Pm arranged per unit area in the main display area MDA.

Figure 2:
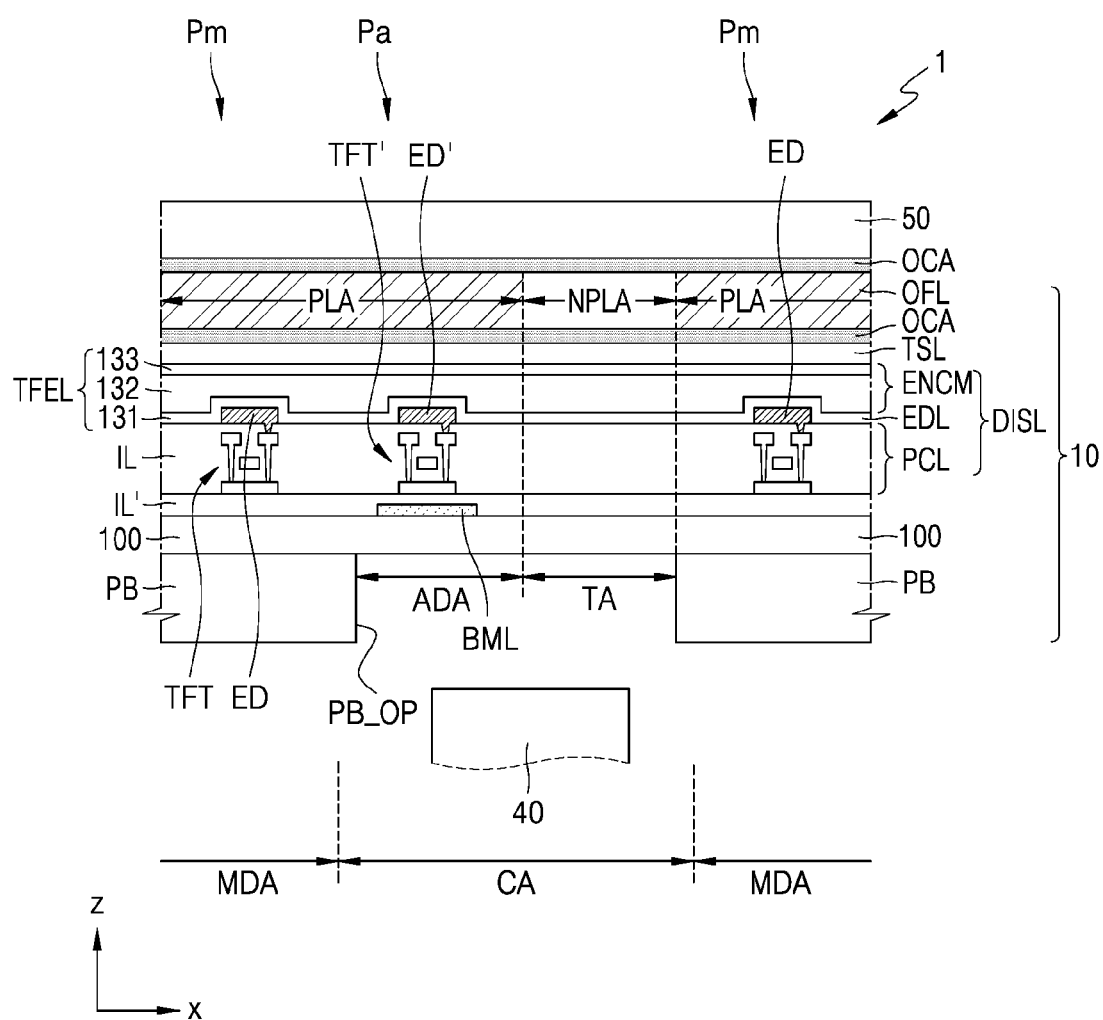
FIG. 2 is a schematic cross-sectional view of a portion of the display device according to an exemplary embodiment.

FIG. 2 is a schematic cross-sectional view of a portion of the display device 1 according to an exemplary embodiment.

Referring to FIG. 2, the display device 1 may include the display panel 10 and the component 40 overlapping the display panel 10. The display device 1 may also include a cover window 50 disposed on the display panel 10.

The display panel 10 includes the component area CA overlapping the component 40 and the main display area MDA where a main image is displayed. The display panel 10 may include a substrate 100, a display layer DISL on the substrate 100, a touch screen layer TSL, an optical functional layer OFL, and a panel protection member PB disposed under the substrate 100.

The display layer DISL may include a circuit layer PCL including thin film transistors TFT and TFT', a display element layer including light-emitting elements ED and ED' that are display elements, and an encapsulation member ENCM, such as a thin film encapsulation layer TFEL or an encapsulation substrate. Insulating layers IL and IL' may be disposed between the substrate 100 and the display layer DISL and in the display layer DISL.

The substrate 100 may include an insulating material, such as glass, quartz, or polymer resin. The substrate 100 may be a rigid substrate or a flexible substrate that is bendable, foldable, or rollable.

A main thin film transistor TFT and a main light-emitting element ED connected thereto may be disposed in the main display area MDA of the display panel 10 to implement the main sub-pixel Pm, and an auxiliary thin film transistor TFT' and an auxiliary light-emitting element ED' connected thereto may be disposed in the component area CA to implement the auxiliary sub-pixel Pa. As used herein, an area of the component area CA where the auxiliary sub-pixel Pa is disposed may be referred to as an auxiliary display area ADA.

The component area CA may include the transmission area TA, where the display element is not disposed. The transmission area TA may be an area where light/signals emitted from the component 40 disposed corresponding to the component area CA, or light/signals incident to the component 40 are transmitted. The auxiliary display area ADA and the transmission area TA may be alternately arranged in the component area CA.

In the component area CA, a bottom metal layer BML may be disposed. The bottom metal layer BML may be disposed to correspond to the bottom of the auxiliary thin film transistor TFT'. For example, the bottom metal layer BML may be disposed between the auxiliary thin film transistor TFT' and the substrate 100. The bottom metal layer BML may prevent external light from reaching the auxiliary thin film transistor TFT'. In some exemplary embodiments, a constant voltage or signals may be applied to the bottom metal layer BML to prevent damage to the pixel circuit from electrostatic discharge or the like. In some exemplary embodiments, a plurality of bottom metal layers BML may be disposed in the component area CA, and different voltages may be applied to the bottom metal layers BML, respectively. In the component area CA, one bottom metal layer BML including a hole that corresponds to the transmission area TA may be disposed.

The display element layer EDL may be covered by the thin film encapsulation layer TFEL or the encapsulation substrate. In some exemplary embodiments, the thin film encapsulation layer TFEL may include at least one inorganic encapsulation layer and at least one organic encapsulation layer. For example, the thin film encapsulation layer TFEL may include first and second inorganic encapsulation layers 131 and 133 and an organic encapsulation layer 132 therebetween, as shown in FIG. 2.

The first and second inorganic encapsulation layers 131 and 133 may include one or more inorganic insulating materials selected from the group consisting of aluminum oxide ($Al_2O_3$), titanium oxide ($TiO_2$), tantalum oxide ($Ta_2O_5$), hafnium oxide ($HfO_2$), zinc oxide ($ZnO_2$), silicon oxide ($SiO_2$), silicon nitride ($SiN_x$), and silicon oxynitride (SiON). The organic encapsulation layer 132 may include a polymer-based material. The polymer-based material may include an acryl-based polymer, an epoxy-based resin, polyimide (PI), polyethylene, and the like.

In some exemplary embodiments, when the display element layer EDL is sealed by the encapsulation substrate, the encapsulation substrate may face the substrate 100 with the display element layer EDL therebetween. A gap may exist between the encapsulation substrate and the display element layer EDL. The encapsulation substrate may include glass. A sealant including frit, for example, may be disposed between the substrate 100 and the encapsulation substrate, and the sealant may be disposed in the display peripheral area DPA described above. The sealant in the display peripheral area DPA may surround the display area DA and prevent the penetration of moisture through a side surface of the display panel 10.

The touch screen layer TSL may obtain coordinate information in response to an external input, such as a touch event. The touch screen layer TSL may include a touch electrode and touch lines connected to the touch electrode. The touch screen layer TSL may detect an external input in a self-capacitance manner or in a mutual capacitance manner.

The touch screen layer TSL may be formed on the thin film encapsulation layer TFEL. Alternatively, the touch screen layer TSL may be formed separately on a touch substrate, and then coupled to the thin film encapsulation layer TFEL by an adhesive layer, such as an optical clear adhesive OCA. In an exemplary embodiment, the touch screen layer TSL may be directly formed on the thin film encapsulation layer TFEL. In this case, the adhesive layer may be obviated between the touch screen layer TSL and the thin film encapsulation layer TFEL.

The optical functional layer OFL may include a reflection prevention layer. The reflection prevention layer may decrease the reflectivity of light (or external light) that is incident to the display device 1 from the outside.

In the illustrated exemplary embodiment, the optical functional layer OFL may be a polarization film. The optical functional layer OFL may include a non-polarization area NPLA corresponding to the transmission area TA. Among the main display area MDA and the component area CA, the optical functional layer OFL may be used as a polarization area in a portion corresponding to the auxiliary display area ADA where the auxiliary sub-pixels Pa are arranged, and may function as a reflection prevention layer of external light. As the optical functional layer OFL includes the non-polarization area NPLA, the light transmittance in the transmission area TA may be greatly improved. The non-polarization area NPLA may be formed by bleaching a portion of the optical functional layer OFL that is a polarization film.

To improve the light transmittance in the transmission area TA, an opening may be formed in the optical functional layer OFL. In this case, however, when the optical functional layer OFL is attached to the cover window 50 or the touch screen layer TSL by the adhesive, such as the optical clear adhesive OCA, and when the optical clear adhesive OCA does not fully fill the opening, bubbles may be generated, which may affect the visibility.

According to an exemplary embodiment, the opening is not formed in the optical functional layer OFL, and the optical functional layer OFL includes the non-polarization area NPLA by bleaching the area corresponding to the transmission area TA. In this manner, the light transmittance may be improved while preventing generation of defects caused by bubbles, etc.

The cover window 50 may be disposed on the display panel 10 to protect the display panel 10.

The optical functional layer OFL may be attached to the cover window 50 or the touch screen layer TSL by the optical clear adhesive OCA. The optical clear adhesive OCA may each be disposed on and under the optical functional layer OFL, or one of the optical clear adhesives OCA may be omitted.

The panel protection member PB may be attached to a lower portion of the substrate 100 and may support and protect the substrate 100. The panel protection member PB may include an opening PB_OP that corresponds to the component area CA. As the panel protection member PB includes the opening PB_OP, the light transmittance of the component area CA may be improved. The panel protection member PB may include polyethyelene terephthalate (PET) or PI.

An area of the component area CA may be greater than an area in which the component 40 is disposed. Accordingly, an area of the opening PB_OP of the panel protection member PB may not be equal to an area of the component area CA.

In some exemplary embodiments, a plurality of components 40 may be arranged in the component area CA. The components 40 may have different functions. For example, the components 40 may include at least two of a camera (or an imaging device), a solar cell, a flash, a proximity sensor, an illuminance sensor, and an iris sensor.

Figure 3:
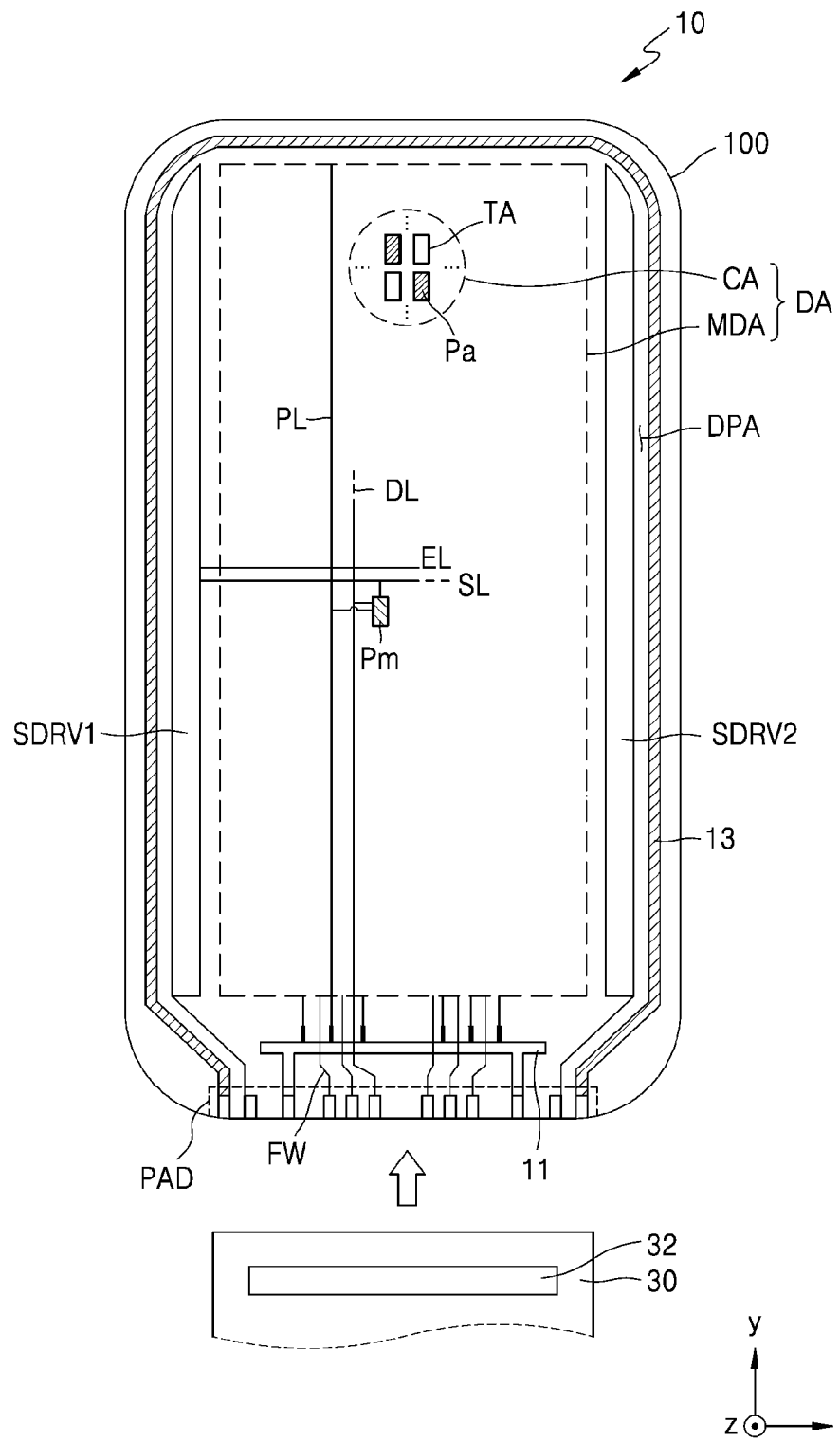
FIG. 3 is a schematic plan view of a display panel according to an exemplary embodiment.

FIG. 3 is a schematic plan view of the display panel 10 according to an exemplary embodiment.

Referring to FIG. 3, various components forming the display panel 10 are arranged on the substrate 100. The substrate 100 includes the display area DA and the display peripheral area DPA surrounding the display area DA. The display area DA includes the main display area MDA where a main image is displayed, the transmission area TA, and the component area CA where an auxiliary image is displayed. The auxiliary image may form the entire image together with the main image or may be a separate image from the main image.

In the main display area MDA, the main sub-pixels Pm are arranged. Each main sub-pixel Pm may be a display element and may include an organic light-emitting diode OLED, for example. Each main sub-pixel Pm may emit red light, green light, blue light, or white light, without being limited thereto. The main display area MDA may be covered by a sealing member, and thus, may be protected from external air, moisture, or the like.

As described above, the component area CA may be disposed on a side of the main display area MDA, or may be disposed inside the display area DA and surrounded by the main display area MDA. In the component area CA, the auxiliary sub-pixels Pa are arranged. Each auxiliary sub-pixel Pa may be a display element and include an organic light-emitting diode OLED, for example. Each auxiliary sub-pixel Pa may emit red light, green light, blue light, or white light, without being limited thereto. The component area CA may be covered by the sealing member and thus may be protected from external air, moisture, or the like.

The component area CA may include the transmission area TA. The transmission area TA may surround the auxiliary sub-pixels Pa. Alternatively, the transmission area TA and the auxiliary sub-pixels Pa may be arranged in a lattice form.

As the component area CA includes the transmission area TA, the resolution of the component area CA may be lower than that of the main display area MDA. For example, the resolution of the component area CA may be about 1/2, 3/8, 1/3, 1/4, 2/9, 1/8, 1/9, 1/16, or the like the resolution of the main display area MDA. As another example, the resolution of the main display area MDA may be equal to or greater than about 400 ppi, and the resolution of the component area CA may be about 200 ppi or about 100 ppi.

Pixel circuits driving the main and auxiliary sub-pixels Pm and Pa may be electrically connected to outer circuits disposed in the display peripheral area DPA, respectively. In the display peripheral area DPA, a first scan driving circuit SDRV1, a second scan driving circuit SDRV2, a terminal PAD, a driving voltage supply line 11, and a common voltage supply line 13 may be disposed.

The first scan driving circuit SDRV1 may transmit scan signals to the pixel circuits driving the main and auxiliary sub-pixels Pm and Pa through scan lines SL, respectively. The first scan driving circuit SDRV1 may transmit emission control signals to the pixel circuits through emission control lines EL, respectively. The second scan driving circuit SDRV2 may be disposed opposite to the first scan driving circuit SDRV1 with respect to the main display area MDA, and may be formed approximately parallel to the first scan driving circuit SDRV1. Some of the pixel circuits of the main sub-pixels Pm of the main display area MDA may be electrically connected to the first scan driving circuit SDRV1, and others thereof may be electrically connected to the second scan driving circuit SDRV2. Some of the pixel circuits of the auxiliary sub-pixels Pa of the component area CA may be electrically connected to the first scan driving circuit SDRV1, and others thereof may be electrically connected to the second scan driving circuit SDRV2. In some exemplary embodiments, the second scan driving circuit SDRV2 may be omitted.

The terminal PAD may be disposed on one side of the substrate 100. The terminal PAD may not be covered by an insulating layer, and may be exposed to the outside to be connected to a display circuit board 30. On the display circuit board 30, a display driver 32 may be disposed. The display driver 32 may generate control signals transmitted to the first and second scan driving circuits SDRV1 and SDRV2. Also, the display driver 32 may supply a driving voltage ELVDD to the driving voltage supply line 11 and a common voltage ELVSS to the common voltage supply line 13. The driving voltage ELVDD may be applied to the pixel circuits of the main and auxiliary sub-pixels Pm and Pa through a driving power line PL connected to the driving voltage supply line 11, and the common voltage ELVSS may be applied to an opposite electrode of the display element through the common voltage supply line 13. The display driver 32 may generate data signals, and the generated data signals may be transmitted to the pixel circuits of the main and auxiliary sub-pixels Pm and Pa through fan-out wire FW and data lines DL connected to the fan-out wire FW.

The driving voltage supply line 11 may extend in an x-direction at the bottom of the main display area MDA. The common voltage supply line 13 may have a loop shape having its one side open, and thus, may partially surround the main display area MDA.

Figure 4A:
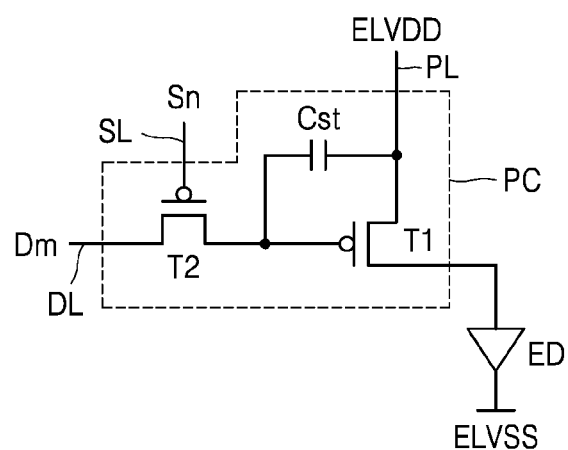
FIGS. 4A and 4B are equivalent circuit diagrams of a pixel circuit for driving sub-pixels according to exemplary embodiments.
Figure 4B:
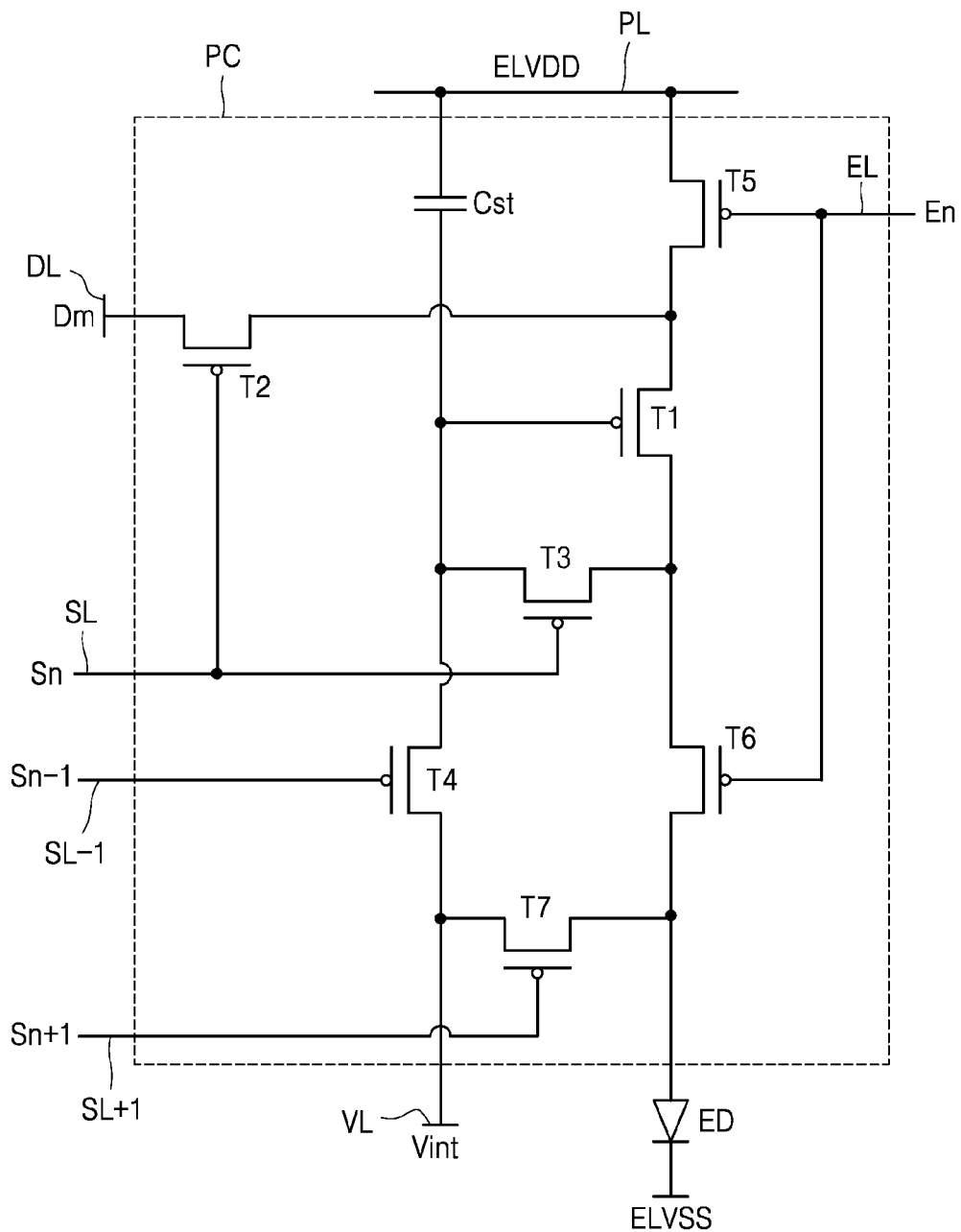

FIGS. 4A and 4B are equivalent circuit diagrams of a pixel circuit used to drive the main and auxiliary sub-pixels Pm and Pa according to exemplary embodiments.

Referring to FIG. 4A, the pixel circuit PC may be connected to the light-emitting element ED and allow the sub-pixels to emit light. The pixel circuit PC includes a driving thin film transistor T1, a switching thin film transistor T2, and a storage capacitor Cst. The switching thin film transistor T2 is connected to the scan line SL and the data line DL, and transmits a data signal Dm input through the data line DL to the driving thin film transistor T1, in response to a scan signal Sn input through the scan line SL.

The storage capacitor Cst is connected to the switching thin film transistor T2 and the driving power line PL, and stores a voltage corresponding to a difference between a voltage from the switching thin film transistor T2 and the driving voltage ELVDD applied to the driving power line PL.

The driving thin film transistor T1 may be connected to the driving power line PL and the storage capacitor Cst, and may control a driving current flowing in the light-emitting element ED from the driving power line PL in accordance to a value of the voltage stored in the storage capacitor Cst. In this manner, the light-emitting element ED may emit light having certain brightness according to a driving current.

The pixel circuit PC of FIG. 4A is exemplarily illustrated as including two thin film transistors and one storage capacitor, but the inventive concepts are not limited thereto.

Referring to FIG. 4B, the pixel circuit PC may include the driving thin film transistor T1, the switching thin film transistor T2, a compensation thin film transistor T3, a first initialization thin film transistor T4, an operation control thin film transistor T5, an emission control thin film transistor T6, and a second initialization thin film transistor T7.

Each pixel circuit PC includes signal lines SL, SL−1, SL+1, EL, and DL, an initialization voltage line VL, and the driving power line PL, without being limited thereto. In another exemplary embodiment, at least one of the signal lines SL, SL−1, SL+1, EL, and DL and/or the initialization voltage line VL may be shared with neighboring pixel circuits.

A drain electrode of the driving thin film transistor T1 may be electrically connected to the light-emitting element ED via the emission control thin film transistor T6. The driving thin film transistor T1 may receive the data signal Dm according to a switching operation of the switching thin film transistor T2, and provides a driving current to the light-emitting element ED.

A gate electrode of the switching thin film transistor T2 is connected to the scan line SL, and a source electrode thereof is connected to the data line DL. A drain electrode of the switching thin film transistor T2 may be connected to the source electrode of the driving thin film transistor T1 and to the driving power line PL via the operation control thin film transistor T5.

The switching thin film transistor T2 is turned on in response to the scan signal Sn transmitted through the scan line SL, and performs a switching operation of transmitting the data signal Dm input through the data line DL to the source electrode of the driving thin film transistor T1.

A gate electrode of the compensation thin film transistor T3 may be connected to the scan line SL. A source electrode of the compensation thin film transistor T3 may be connected to the drain electrode of the driving thin film transistor T1, and may be connected to a pixel electrode of the light-emitting element ED via the emission control thin film transistor T6. A drain electrode of the compensation thin film transistor T3 may be connected to any one of the storage capacitor Cst, a source electrode of the first initialization thin film transistor T4, and a gate electrode of the driving thin film transistor T1. The compensation thin film transistor T3 is turned on in response to the scan signal Sn transmitted through the scan line SL and diode-connects the driving thin film transistor T1 by connecting the gate electrode and the drain electrode of the driving thin film transistor T1 to each other.

A gate electrode of the first initialization thin film transistor T4 may be connected to a previous scan line SL−1. A drain electrode of the first initialization thin film transistor T4 may be connected to an initialization voltage line VL. A source electrode of the first initialization thin film transistor T4 may be connected to any one of the storage capacitor Cst, the drain electrode of the compensation thin film transistor T3, and the gate electrode of the driving thin film transistor T1. The first initialization thin film transistor T4 is turned on in response to a previous scan signal Sn−1 transmitted through the previous scan line SL−1 and transmits an initialization voltage Vint to the gate electrode of the driving thin film transistor T1, thereby performing an operation of initializing a voltage of the gate electrode of the driving thin film transistor T1.

A gate electrode of the operation control thin film transistor T5 may be connected to the emission control line EL. A source electrode of the operation control thin film transistor T5 may be connected to the driving power line PL. A drain electrode of the operation control thin film transistor T5 may be connected to the source electrode of the driving thin film transistor T1 and the drain electrode of the switching thin film transistor T2.

A gate electrode of the emission control thin film transistor T6 may be connected to the emission control line EL. A source electrode of the emission control thin film transistor T6 may be connected to the drain electrode of the driving thin film transistor T1 and the source electrode of the compensation thin film transistor T3. A drain electrode of the emission control thin film transistor T6 may be electrically connected to the pixel electrode of the light-emitting element ED. The operation control thin film transistor T5 and the emission control thin film transistor T6 are simultaneously turned on in response to the emission control signal Sn transmitted through the emission control line EL, and the driving voltage ELVDD is transmitted to the light-emitting element ED. In this manner, the driving current may flow in the light-emitting element ED.

A gate electrode of the second initialization thin film transistor T7 may be connected to a subsequent scan line SL+1. A source electrode of the second initialization thin film transistor T7 may be connected to the pixel electrode of the light-emitting element ED. A drain electrode of the second initialization thin film transistor T7 may be connected to the initialization voltage line VL. The second initialization thin film transistor T7 may be turned on in response to a subsequent scan signal Sn+1 transmitted through the subsequent scan line SL+1, and may initialize the pixel electrode of the light-emitting element ED.

The first initialization thin film transistor T4 and the second initialization thin film transistor T7 of FIG. 4B are exemplarily illustrated as being connected to the previous scan line SL−1 and the subsequent scan line SL+1, respectively, however, the inventive concepts are not limited thereto. In another exemplary embodiment, the first initialization thin film transistor T4 and the second initialization thin film transistor T7 may be connected to the previous scan line SL−1 and driven in response to the previous scan signal SL−1

The other electrode of the storage capacitor Cst may be connected to the driving power line PL. Any one of the electrodes of the storage capacitor Cst may be connected to the gate electrode of the driving thin film transistor T1, the drain electrode of the compensation thin film transistor T3, and the source electrode of the first initialization thin film transistor T4.

The common voltage ELVSS may be applied to an opposite electrode (e.g., a cathode) of the light-emitting element ED. The light-emitting element ED emits light as the driving current is transmitted thereto from the driving thin film transistor T1.

The pixel circuit PC according to an exemplary embodiment is not limited to the number of thin film transistors, the number of storage capacitors, and circuit designs described with reference to FIGS. 4A and 4B, and in some exemplary embodiments, the number of the thin film transistors and the storage capacitors, and the circuit designs may be varied.

The pixel circuits PC driving the main sub-pixels Pm and the auxiliary sub-pixels Pa may be the same as each other or different from each other. For example, the pixel circuit PC driving the main sub-pixels Pm and the auxiliary sub-pixels Pa may be the pixel circuit PC shown in FIG. 4B. In another exemplary embodiment, the pixel circuit PC driving the main sub-pixel Pm uses the pixel circuit PC shown in FIG. 4B, and the pixel circuit PC driving the auxiliary sub-pixel Pa may use the pixel circuit PC shown in FIG. 4A, or vice versa.

Figure 5:
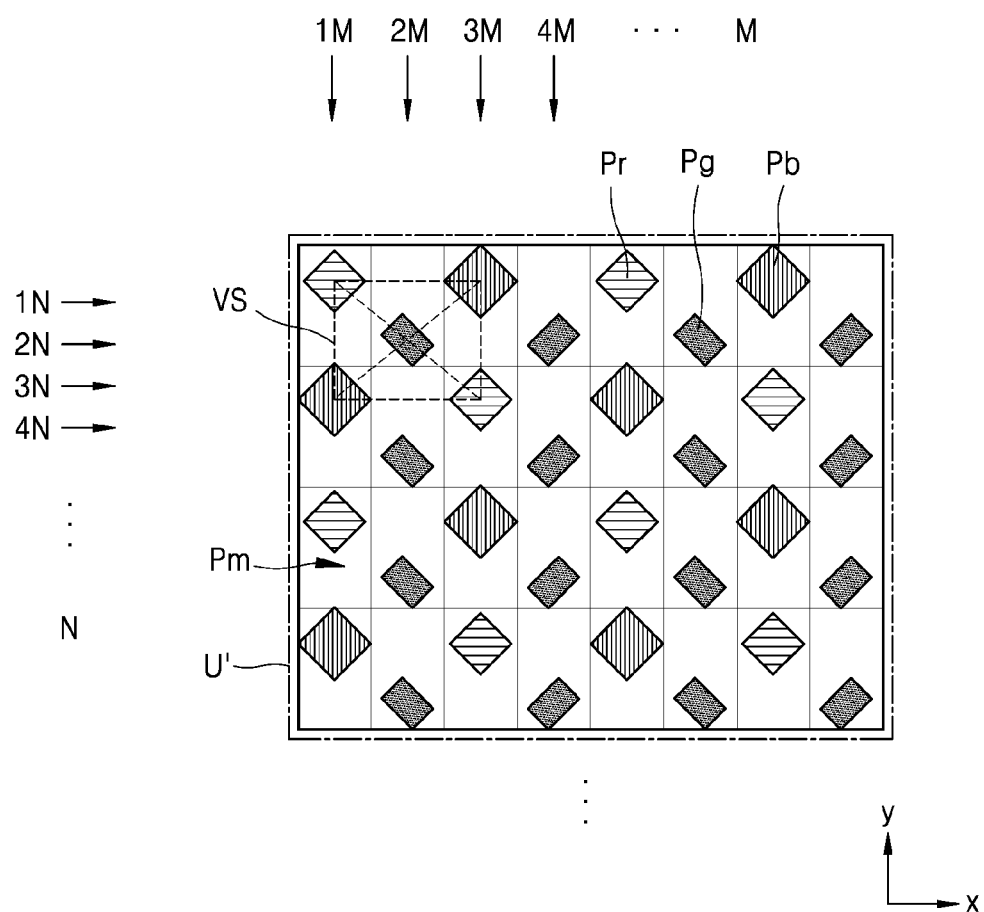
FIG. 5 is a schematic layout view of a pixel arrangement in a main display area according to an exemplary embodiment.

FIG. 5 is a schematic layout view of a pixel arrangement structure in the main display area according to an exemplary embodiment.

In the main display area MDA, the main sub-pixels Pm may be arranged. As used herein, a sub-pixel may be a minimum unit for representing an image and indicate an emission area. When the organic light-emitting diode is used as a display element, for example, the emission area may be defined by an opening of a pixel-defining layer, which will be described in more detail below.

Referring to FIG. 5, the main sub-pixels Pm in the main display area MDA may be arranged in a pentile form. Red sub-pixels Pr, green sub-pixels Pg, and blue sub-pixels Pb may respectively realize red, green, and blue.

The red sub-pixels Pr and the blue sub-pixels Pb are alternately arranged in a first row 1N, the green sub-pixels Pg are arranged at certain intervals in an adjacent second row 2N, the blue sub-pixels Pb and the red sub-pixels Pr are alternately arranged in an adjacent third row 3N, the green sub-pixels Pg are arranged at certain intervals in an adjacent fourth row 4N, and such pixel arrangements are repeated to an $N^{th}$ row. In this case, the blue sub-pixels Pb and the red sub-pixels Pr may be greater in size than the green sub-pixels Pg.

The red sub-pixels Pr and the blue sub-pixels Pb arranged in the first row 1N and the green sub-pixels Pg arranged in the second row 2N are alternately arranged. As such, the red sub-pixels Pr and the blue sub-pixels Pb are alternately arranged in a first column 1M, the green sub-pixels Pg are arranged apart from each other at certain intervals in an adjacent second column 2M, the blue sub-pixels Pb and the red sub-pixels Pr are alternately arranged in an adjacent third column 3M, the green sub-pixels Pg are arranged apart from each other at certain intervals in an adjacent fourth column 4M, and such pixel arrangements are repeated to an $M^{th}$ column.

More particularly, the red sub-pixels Pr are arranged on first and third vertices, which face each other from among vertices of a virtual square VS having a central point of the green sub-pixel Pg as a central point of the virtual square VS, and the blue sub-pixels Pb are arranged on the remaining second and fourth vertices. In some exemplary embodiments, the virtual square VS may be variously changed to, for example, a rectangle, a rhombus, a square, or the like.

Such pixel arrangement structures are referred to as a pentile matrix structure or a pentile structure, and by applying a rendering operation for expressing colors by sharing adjacent pixels, a high resolution may be achieved with a small number of pixels.

The main sub-pixels Pm according to the illustrated exemplary embodiment are arranged in a pentile matrix form, as shown in FIG. 5, however, the inventive concepts are not limited thereto. For example, the main sub-pixels Pm may be arranged in various forms, such as a stripe structure, a mosaic arrangement structure, and a delta arrangement structure.

Figure 6A:
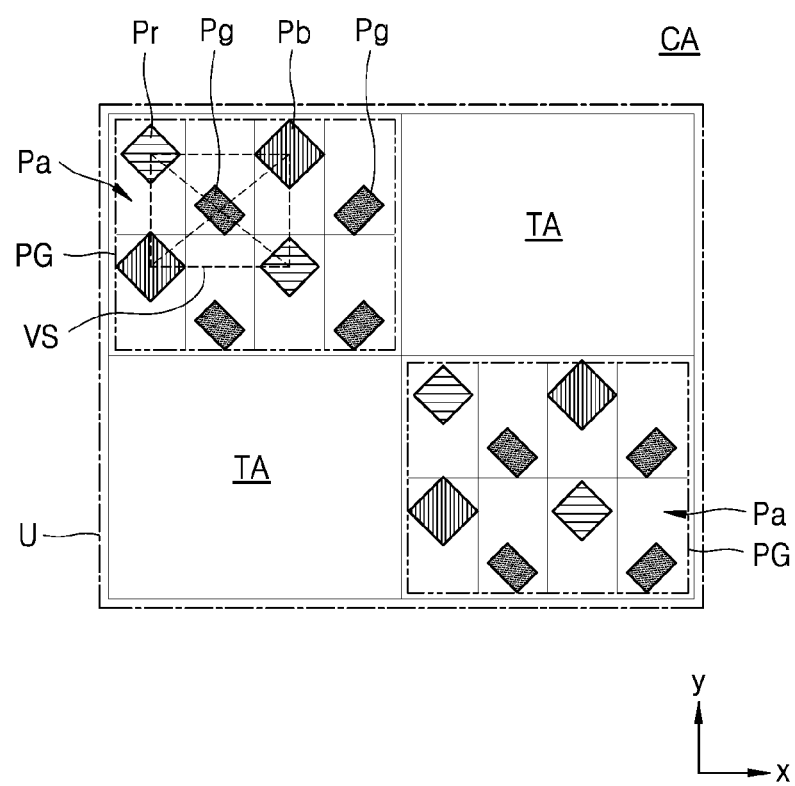
FIGS. 6A and 6B are schematic layout views of pixel arrangement structures in a component area according to exemplary embodiments.
Figure 6B:
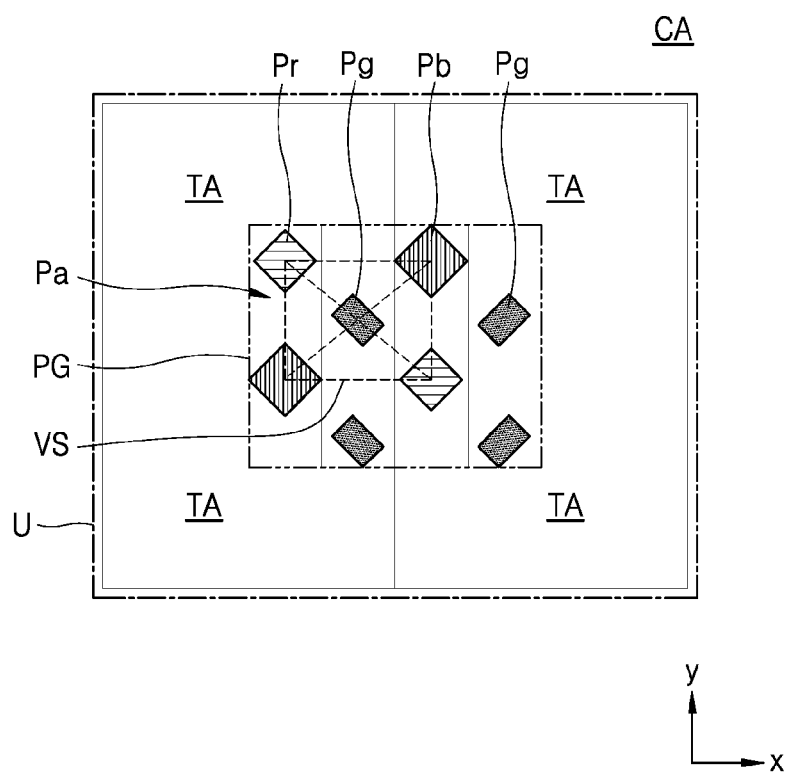

FIGS. 6A and 6B are schematic layout views of pixel arrangement structures in the component area CA according to an exemplary embodiment.

Referring to FIG. 6, the auxiliary sub-pixels Pa may be arranged in the component area CA. Each of the auxiliary sub-pixels Pa may emit any one of red light, green light, blue light, and white light.

The component area CA may include the transmission areas TA and pixel groups PG each including at least one auxiliary sub-pixel Pa. The pixel groups PG and the transmission areas TA may be alternately arranged in the x-direction and the y-direction, for example, to be arranged in a lattice form. In this case, the component area CA may include a plurality of pixel groups PG and a plurality of transmission areas TA.

The pixel group PG may be defined as an aggregate of sub-pixels that include the auxiliary sub-pixels Pa gathered in a preset unit. For example, as shown in FIG. 6A, one pixel group PG may include eight auxiliary sub-pixels Pa arranged in a pentile form. In particular, one pixel group PG may include two red sub-pixels Pr, four green sub-pixels Pg, and two blue sub-pixels Pb.

In the component area CA, basic units U including both a certain number of pixel groups PG and a certain number of transmission areas TA may be repeatedly arranged in the x-direction and the y-direction. As shown in FIG. 6A, the basic unit U may have a shape in which two pixel groups PG and two transmission areas TA around the pixel groups PG are gathered in a square form. The basic unit U is defined by sectioning repeated shapes, and does not indicate that structures are disconnected.

In the main display area MDA, a corresponding unit U' having the same area as the basic unit U may be defined. In this case, the number of main sub-pixels Pm included in the corresponding unit U' may be greater than the number of auxiliary sub-pixels Pa included in the basic unit U. For example, when the number of auxiliary sub-pixels Pa included in the basic unit U is 16, the number of main sub-pixels Pm included in the corresponding unit U' may be 32. A ratio of the number of auxiliary sub-pixels Pa to the number of main sub-pixels Pm per same area may be 1:2, without being limited thereto.

As shown in FIG. 6A, the pixel arrangement structure of the auxiliary sub-pixels Pa is a pentile structure, and the pixel arrangement structure of the component area CA is a ½ pentile structure, as the resolution of the component area CA is ½ of that of the main display area MDA. The number or the arrangement structure of the auxiliary sub-pixels Pa included in the pixel group PG may be varied according to the resolution of the component area CA.

Referring to FIG. 6B, the pixel arrangement structure of the component area CA may be a ¼ pentile structure. In the illustrated exemplary embodiment, in a pixel group PG, eight auxiliary sub-pixels Pa may be arranged in a pentile form, but the basic unit U may include only one pixel group PG. Remaining areas of the basic unit U may be the transmission areas TA. The number of auxiliary sub-pixels Pa and the number of main sub-pixels Pm arranged per the same area may be in a ratio of 1:4. In this case, one pixel group PG may be surrounded by the transmission area TA.

Figure 7:
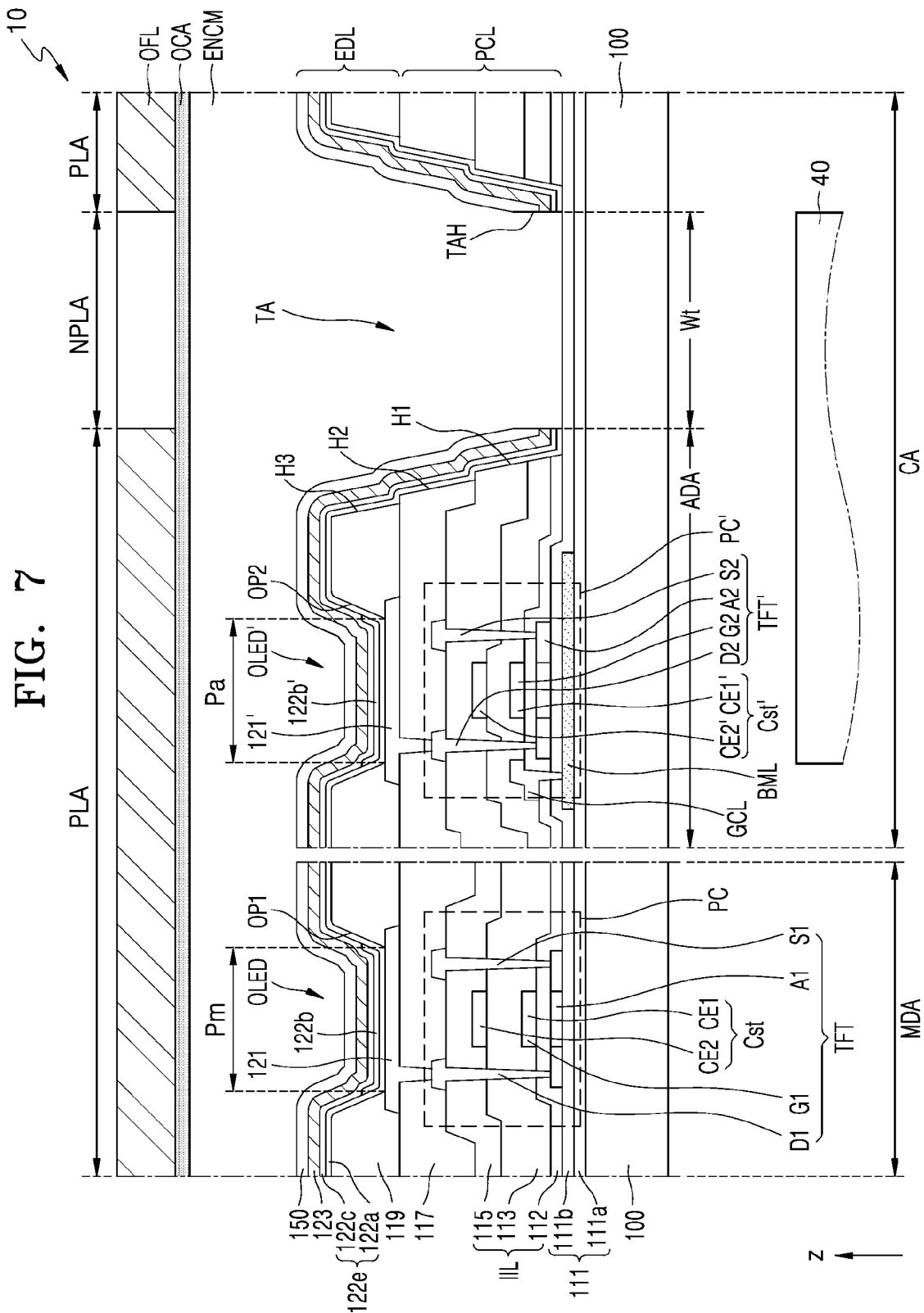
FIG. 7 is a schematic cross-sectional view of a portion of the display panel according to an exemplary embodiment schematically illustrating a main display area and a component area.

FIG. 7 is a schematic cross-sectional view of a portion of the display panel 10 according to an exemplary embodiment, and schematically shows the main display area MDA and the component area CA.

Referring to FIG. 7, the display panel 10 includes the main display area MDA and the component area CA. In the main display area MDA, the main sub-pixels Pm are arranged. The component area CA includes the auxiliary display area ADA, where in the auxiliary sub-pixels Pa are arranged, and the transmission area TA. In the main display area MDA, a main pixel circuit PC including a main thin film transistor TFT and a main storage capacitor Cst, and a main organic light-emitting diode OLED connected to the main pixel circuit PC as a display element may be arranged. In the auxiliary display area ADA, an auxiliary pixel circuit PC' including an auxiliary thin film transistor TFT' and an auxiliary storage capacitor Cst', and an auxiliary organic light-emitting diode OLED' connected to the auxiliary pixel circuit PC' as a display element may be arranged.

Display elements of the display panel 10 are protected by the encapsulation member ENCM, and the optical functional layer OFL is disposed on the encapsulation member ENCM. The optical functional layer OFL includes the polarization area PLA, which corresponds to the main display area MDA and the auxiliary display area ADA, and the non-polarization area NPLA corresponding to the transmission area TA. The optical clear adhesive OCA may be disposed between the optical functional layer OFL and the encapsulation member ENCM.

In the illustrated exemplary embodiment, organic light-emitting diodes are used as display elements, but in some exemplary embodiments, inorganic light-emitting diodes or quantum dot light-emitting diodes may be used as display elements.

Hereinafter, a structure in which components included in the display panel 10 are stacked will be described. The display panel 10 may include the substrate 100, a buffer layer 111, the circuit layer PCL, the display element layer EDL, the encapsulation member ENCM, and the optical functional layer OFL stacked one over another.

As described above, the substrate 100 may include an insulating material, such as glass, quartz, or polymer resin. The substrate 100 may be a rigid display panel that is hardly bent due to its rigidity, or a flexible display panel that may be easily bent, folded, or rolled due to its flexibility.

The buffer layer 111 may be disposed on the substrate 100 and may decrease or block the penetration of foreign materials, moisture, or external air from the bottom of the substrate 100, thereby providing a flat surface on the substrate 100. The buffer layer 111 may include an inorganic material such as oxide or nitride, an organic material, or a composite of organic/inorganic materials, and may have a single-layer structure or a multilayered structure including organic/inorganic materials. Between the substrate 100 and the buffer layer 111, a barrier layer preventing the penetration of external air may be further disposed. In some exemplary embodiments, the buffer layer 111 may include silicon oxide ($SiO_2$) or silicon nitride ($SiN_x$). The buffer layer 111 may include a first buffer layer 111a and a second buffer layer 111b that are stacked.

In the component area CA, the bottom metal layer BML may be disposed between the first buffer layer 111a and the second buffer layer 111b. In another exemplary embodiment, the bottom metal layer BML may be disposed between the substrate 100 and the first buffer layer 111a. The bottom metal layer BML may be disposed under the auxiliary pixel circuit PC' and prevent deterioration in characteristics of the auxiliary thin film transistor TFT', which may be caused by light emitted from the component, etc. Also, the bottom metal layer BML may prevent light, which is emitted from the component, etc. or directed thereto, from being diffracted through a narrow gap between lines connected to the auxiliary pixel circuit PC'. The bottom metal layer BML may not be disposed in the transmission area TA.

The bottom metal layer BML may be connected to a line GCL, which is disposed on a different layer, through a contact hole. The bottom metal layer BML may receive a constant voltage or signals from the line GCL. For example, the bottom metal layer BML may receive the driving voltage ELVDD or scan signals. As the bottom metal layer BML receives a constant voltage or a signal, the probability that the electrostatic discharge occurs may be decreased substantially. The bottom metal layer BML may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu). The bottom metal layer BML may be a monolayer or multilayers including the above material(s).

The circuit layer PCL may be disposed on the buffer layer 111, and may include the pixel circuits PC and PC', a first gate insulating layer 112, a second gate insulating layer 113, an interlayer insulating layer 115, and a planarization layer 117. The main pixel circuit PC may include the main thin film transistor TFT and the main capacitor Cst, and the auxiliary pixel circuit PC' may include the auxiliary thin film transistor TFT' and the auxiliary capacitor Cst'.

On the buffer layer 111, the main thin film transistor TFT and the auxiliary thin film transistor TFT' may be disposed. The main thin film transistor TFT includes a first semiconductor layer A1, a first gate electrode G1, a first source electrode S1, and a first drain electrode D1, and the auxiliary thin film transistor TFT' includes a second semiconductor layer A2, a second gate electrode G2, a second source electrode S2, and a second drain electrode D2. The main thin film transistor TFT may be connected to the main organic light-emitting diode OLED and drive the same. The auxiliary thin film transistor TFT' may be connected to the auxiliary organic light-emitting diode OLED' and drive the same.

The first and second semiconductor layers A1 and A2 may be disposed on the buffer layer 111 and include polysilicon. In another exemplary embodiment, the first and second semiconductor layers A1 and A2 may include amorphous silicon. In still another exemplary embodiment, the first and second semiconductor layers A1 and A2 may each include at least one oxide selected from the group consisting of indium (In), gallium (Ga), stannum (Sn), zirconium (Zr), vanadium (V), hafnium (Hf), cadmium (Cd), germanium (Ge), Cr, Ti, and zinc (Zn). The first and second semiconductor layers A1 and A2 may each include a channel area and source and drain areas doped with impurities.

The second semiconductor layer A2 may overlap the bottom metal layer BML with the second buffer layer 111b therebetween. In an exemplary embodiment, a width of the second semiconductor layer A2 may be less than that of the bottom metal layer BML, and thus, when projected in a direction perpendicular to the substrate 100, the second semiconductor layer A2 may entirely overlap the bottom metal layer BML.

The first gate insulating layer 112 may cover the first and second semiconductor layers A1 and A2. The first gate insulating layer 112 may include an inorganic insulating material, such as $SiO_2$, $SiN_x$, silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may include a monolayer or multilayers including the above inorganic insulating material(s).

On the first gate insulating layer 112, the first gate electrode G1 and the second gate electrode G2 may be disposed to overlap the first semiconductor layer A1 and the second semiconductor layer A2, respectively. The first gate electrode G1 and the second gate electrode G2 may be a monolayer or multilayers including Mo, Al, Cu, Ti, or the like. For example, the first gate electrode G1 and the second gate electrode G2 may each be a monolayer including Mo.

The second gate insulating layer 113 may cover the first gate electrode G1 and the second gate electrode G2. The second gate insulating layer 113 may include an inorganic insulating material, such as $SiO_2$, $SiN_x$, SiON, $Al_2O_3$, $TiO_2$, $Ta_2O_5$, $HfO_2$, or $ZnO_2$. The second gate insulating layer 113 may be a monolayer or multilayers including the above inorganic insulating material(s).

On the second gate insulating layer 113, a first upper electrode CE2 of the main storage capacitor Cst and a second upper electrode CE2' of the auxiliary storage capacitor Cst' may be disposed.

In the main display area MDA, the first upper electrode CE2 may overlap the first gate electrode G1 disposed thereunder. The first gate electrode G1 and the first upper electrode CE2, which overlap each other with the second gate insulating layer 113 therebetween, may form the main storage capacitor Cst. The first gate electrode G1 may be a first lower electrode CE1 of the main capacitor Cst.

In the component area CA, the second upper electrode CE2' may overlap the second gate electrode G2 disposed thereunder. The second gate electrode G2 and the second upper electrode CE2', which overlap each other with the second gate insulating layer 113 therebetween, may form the auxiliary capacitor Cst'. The first gate electrode G1 may be the second lower electrode CE1' of the auxiliary storage capacitor Cst'.

The first upper electrode CE2 and the second upper electrode CE2' may each include Al, Pt, Pd, Ag, Mg, Au, Ni, Nd, Ir, Cr, Ca, Mo, Ti, W, and/or Cu, and may be a monolayer or multilayers including the above material(s).

The interlayer insulating layer 115 may cover the first upper electrode CE2 and the second upper electrode CE2'. The interlayer insulating layer 115 may include $SiO_2$, $SiN_x$, SION, $Al_2O_3$, $TiO_2$, $Ta_2O_5$, $HfO_2$, $ZnO_2$, or the like. The interlayer insulating layer 115 may be a monolayer or multilayers including the above inorganic insulating material(s).

When the first gate insulating layer 112, the second gate insulating layer 113, and the interlayer insulating layer 115 are collectively referred to as an inorganic insulating layer IIL, the inorganic insulating layer IIL may have a first hole H1 corresponding to the transmission area TA. The first hole H1 may expose part of an upper surface of the buffer layer 111 or the substrate 100. The first hole H1 may be formed as an opening of the first gate insulating layer 112, an opening of the second gate insulating layer 113, and an opening of the interlayer insulating layer 115, and the openings correspond to the transmission area TA. Such openings may be separately formed through separate processes or simultaneously formed through the same process. When the openings are formed through separate processes, an inner surface of the first hole H1 may not be smooth, and the first hole H1 may have a step difference, for example, a stair shape.

In some exemplary embodiments, the inorganic insulating layer IIL may have a groove instead of the first hole 1H through which the buffer layer 111 is exposed. Alternatively, the inorganic insulating layer IIL may not have the groove or the first hole 1H corresponding to the transmission area TA. In this case, because the inorganic insulating layer IIL includes an inorganic insulating material that mostly has great light transmittance, the inorganic insulating layer IIL may have sufficient transmittance even though there is no hole or groove corresponding to the transmission area TA.

As such, the inorganic insulating layer IIL may allow the component receive/transmit a sufficient amount of light.

The source electrodes S1 and S2 and the drain electrodes D1 and D2 are disposed on the interlayer insulating layer 115. The source electrodes S1 and S2 and the drain electrodes D1 and D2 may each include a conductive material, such as Mo, Al, Cu, or Ti, and may be multilayers or a monolayer including the above material(s). For example, the source electrodes S1 and S2 and the drain electrodes D1 and D2 may have a multilayered structure of Ti/Al/Ti.

The planarization layer 117 may be disposed to cover the source electrodes S1 and S2 and the drain electrodes D1 and D2. The planarization layer 117 may have a flat upper surface so that a first pixel electrode 121 and a second pixel electrode 121' disposed thereabove may be flat.

The planarization layer 117 may include an organic material or an inorganic material, and may have a monolayer structure or a multilayered structure. The planarization layer 117 may include general-purpose polymer such as benzocyclobutene (BCB), PI, hexamethyldisiloxane (HMDSO), polymethylmethacrylate (PMMA) or polystyrene (PS), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, or the like. The planarization layer 117 may include an inorganic insulating material, such as $SiO_2$, $SiN_x$, SiON, $Al_2O_3$, $TiO_2$, $Ta_2O_5$, $HfO_2$, or $ZnO_2$. When the planarization layer 117 is formed, mechano-chemical polishing may be performed on an upper surface of the planarization layer 117 to provide a flat upper surface after the formation of the planarization layer 117.

The planarization layer 117 may have a second hole H2 corresponding to the transmission area TA. The second hole H2 may overlap the first hole H1. Referring to FIG. 7, the second hole H2 is greater than the first hole H1. In another exemplary embodiment, the planarization layer 117 may cover a periphery of the first hole H1 of the inorganic insulating layer IIL, and an area of the second hole H2 may be less than that of the first hole H1.

The planarization layer 117 may have a via hole through which any one of the first source electrode S1 and the first drain electrode D1 of the main thin film transistor TFT is exposed, and the first pixel electrode 121 may be electrically connected to the main thin film transistor TFT by contacting the first source electrode S1 or the first drain electrode D1 through the via hole. The planarization layer 117 may also have a via hole through which any one of the second source electrode S2 and the second drain electrode D2 of the auxiliary thin film transistor TFT' is exposed, and the second pixel electrode 121' may be electrically connected to the auxiliary thin film transistor TFT' by contacting the second source electrode S2 or the second drain electrode D2 through the via hole.

The first pixel electrode 121 and the second pixel electrode 121' may each include conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). The first pixel electrode 121 and the second pixel electrode 121' may include a reflective layer including Ag, Mg, Al, Pt, Pd, Au, Ni, Nd, Ir, Cr, or a compound thereof. For example, the first pixel electrode 121 and the second pixel electrode 121' may have a structure in which layers including ITO, IZO, ZnO or $In_2O_3$ are disposed above and/or under the reflective layer. In this case, the first pixel electrode 121 and the second pixel electrode 121' may have a stack structure of ITO/Ag/ITO, for example.

A pixel-defining layer 119 may cover edges of each of the first pixel electrode 121 and the second pixel electrode 121' on the planarization layer 117, and may include first and second openings OP1 and OP2 exposing centers of the first and second pixel electrodes 121 and 121'. Emission areas of the organic light-emitting diodes OLED and OLED', that is, sizes and shapes of the main and auxiliary sub-pixels Pm and Pa, are defined by the first and second openings OP1 and OP2.

The pixel-defining layer 119 may prevent arcs, etc. from being generated at edges of the pixel electrodes 121 and 121' by increasing a distance between the edges of the pixel electrodes 121 and 121' and the opposite electrode 123 disposed above the pixel electrodes 121 and 121'. The pixel-defining layer 119 may include an organic insulating material, such as PI, polyamide, acryl resin, BCB, HMDSO, and phenol resin, and may be formed by using a spin coating method, etc.

The pixel-defining layer 119 may include a third hole H3 located in the transmission area TA. The third hole H3 may overlap the first hole H1 and the second hole H2. Due to the first to third holes H1 to H3, the light transmittance of the transmission area TA may be improved. As shown in FIG. 7, the buffer layer 111 is continuously disposed corresponding to the transmission area TA, but the buffer layer 111 may include a hole located in the transmission area TA. On inner surfaces of the first to third holes H1 to H3, part of the opposite electrode 123 described below may be disposed.

Inside the first opening OP1 and the second opening OP2 of the pixel-defining layer 119, a first emission layer 122b and a second emission layer 122b' are disposed respectively corresponding to the first pixel electrode 121 and the second pixel electrode 121'. The first emission layer 122b and the second emission layer 122b' may include a polymer material or a low molecular weight material, and may emit red light, green light, blue light, or white light.

An organic functional layer 122e may be disposed above and/or under the first emission layer 122b and the second emission layer 122b'. The organic functional layer 122e may include a first functional layer 122a and/or a second functional layer 122c. In some exemplary embodiments, the first functional layer 122a or the second functional layer 122c may be omitted.

The first functional layer 122a may be disposed under the first emission layer 122b and the second emission layer 122b'. The first functional layer 122a may be a monolayer or multilayers including an organic material. The first functional layer 122a may be a hole transport layer (HTL) having a monolayer structure. Alternatively, the first functional layer 122a may include a hole injection layer (HIL) and an HTL. The first functional layer 122a may be integrally formed to correspond to the organic light-emitting diodes OLED and OLED' included in the main display area MDA and the component area CA.

The second functional layer 122c may be disposed on the first emission layer 122b and the second emission layer 122b'. The second functional layer 122c may be a monolayer or multilayers including an organic material. The second functional layer 122c may include an electron transport layer (ETL) and/or an electron injection layer (EIL). The second functional layer 122c may be integrally formed to correspond to the organic light-emitting diodes OLED and OLED' included in the main display area MDA and the component area CA.

The opposite electrode 123 is disposed on the second functional layer 122c. The opposite electrode 123 may include a conductive material having a low work function. For example, the opposite electrode 123 may include a translucent transparent layer (or translucent layer) including Ag, Mg, Al, Pt, Pd, Au, Ni, Nd, Ir, Cr, Li, Ca, or an alloy thereof. Alternatively, the opposite electrode 123 may further include a layer including ITO, IZO, ZnO, or $In_2O_3$ on the transparent layer (or translucent layer) including the aforementioned material(s). The opposite electrode 123 may be integrally formed to correspond to the organic light-emitting diodes OLED and OLED' included in the main display area MDA and the component area CA.

Layers that are formed from the first pixel electrode 121 to the opposite electrode 123 in the main display area MDA may form the main organic light-emitting diode OLED. Layers that are formed from the second pixel electrode 121' to the opposite electrode 123 in the component area CA may form the auxiliary organic light-emitting diode OLED'.

On the opposite electrode 123, an upper layer 150 including an organic material may be formed. The upper layer 150 may protect the opposite electrode 123 and improve the light extraction efficiency. The upper layer 150 may include an organic material having a greater refractive index than that of the opposite electrode 123. Alternatively, the upper layer 150 may be formed by stacking layers having different refractive indices. For example, the upper layer 150 may be formed by stacking a high refractive index layer/a low refractive index layer/a high refractive index layer. In this case, a refractive index of the high refractive index layer may be equal to or greater than 1.7, and a refractive index of the low refractive index layer may be less than or equal to 1.3.

The upper layer 150 may additionally include LiF. Alternatively, the upper layer 150 may additionally include an inorganic insulating material, such as $SiO_2$ or $SiN_x$.

The first functional layer 122a, the second functional layer 122c, the opposite electrode 123, and the upper layer 150 may include a through hole TAH corresponding to the transmission area TA. More particularly, first functional layer 122a, the second functional layer 122c, the opposite electrode 123, and the upper layer 150 may respectively have openings corresponding to the transmission area TA. Areas of the openings may be substantially the same. For example, an area of the opening of the opposite electrode 123 may be substantially the same as an area of the through hole TAH.

As used herein, the description that the through hole TAH corresponds to the transmission area TA may refer that the through hole TAH overlaps the transmission area TA. In this case, the area of the through hole TAH may be less than that of the first hole H1 formed in the inorganic insulating layer IIL. As such, a width Wt of the through hole TAH shown in FIG. 7 is less than the width of the first hole H1. The area of the through hole TAH may be defined as an area of an opening having the least area among the openings forming the through hole TAH. The area of the first hole H1 may also be defined as an area of an opening having the least area among the openings forming the first hole H1.

Due to the through hole TAH, part of the opposite electrode 123 may not be disposed in the transmission area TA, and thus, the light transmittance in the transmission area TA may be greatly improved. The opposite electrode 123 including the above through hole TAH may be formed by using various methods. For example, after a material forming the opposite electrode 123 is formed on the entire substrate 100, a portion of the opposite electrode 123 corresponding to the transmission area TA is removed through laser lift off, and thus, the opposite electrode 123 having the through hole TAH may be formed. In another exemplary embodiment, the opposite electrode 123 having the through hole TAH may be formed by using a metal self-patterning (MSP) method. In another exemplary embodiment, the opposite electrode 123 having the through hole TAH may be formed by using a method of depositing the opposite electrode 123 by using a fine metal mask (FMM).

The encapsulation member ENCM may be disposed on the display element layer EDL and may seal the organic light-emitting diodes OLED and OLED'. The encapsulation member ENCM may be a thin film encapsulation layer or an encapsulation substrate.

The optical functional layer OFL is disposed on the encapsulation member ENCM. The optical functional layer OFL may be attached to the encapsulation member ENCM by the optical clear adhesive OCA.

The optical functional layer OFL may decrease the reflectivity of external light. The optical functional layer OFL according to the illustrated exemplary embodiment may include the polarization area PLA and the non-polarization area NPLA. The polarization area PLA of the optical functional layer OFL may be disposed to correspond to the auxiliary display area ADA among the main display area MDA and the component area CA. The non-polarization area NPLA of the optical functional layer OFL may correspond to the transmission area TA.

Because the optical functional layer OFL includes the non-polarization area NPLA, the light transmittance in the transmission area TA may be greatly improved. The non-polarization area NPLA may be formed by bleaching part of the optical functional layer OFL that is a polarization film. Accordingly, an upper surface of the non-polarization area NPLA in the optical functional layer OFL may form the same surface as an upper surface of the polarization area PLA. Also, because the non-polarization area NPLA does not polarize light, the non-polarization area NPLA may have greater light transmittance than the polarization area PLA.

As describe above, to improve the light transmittance of the transmission area TA, an opening may be formed in the optical functional layer OFL. However, when the optical functional layer OFL is attached to the cover window 50 or the touch screen layer TSL by an adhesive, such as the optical clear adhesive OCA, and when the optical clear adhesive OCA does not fully fill the opening, bubbles may be generated thereby affecting the visibility.

According to an exemplary embodiment, the optical functional layer OFL does not include an opening and includes the non-polarization area NPLA by bleaching an area corresponding to the transmission area TA. In this manner, the light transmittance may be improved while preventing defects caused by bubbles, etc.

Figure 8:
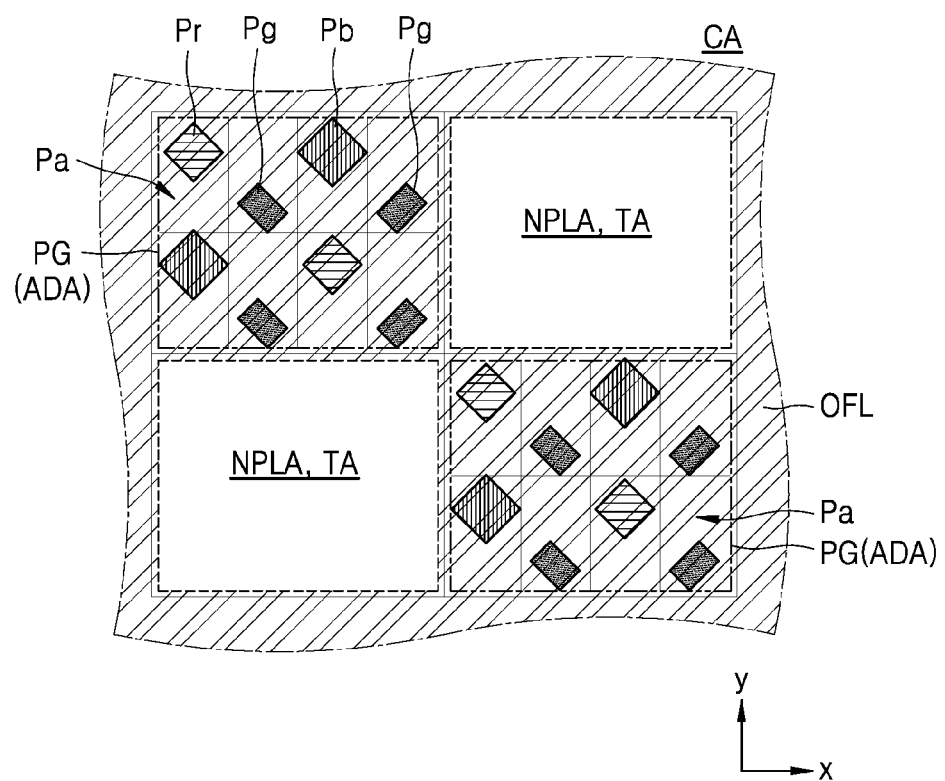
FIG. 8 is a schematic plan view of a portion of the component area of the display panel according to an exemplary embodiment.

FIG. 8 is a schematic plan view of a portion of the component area CA of the display panel 10 according to an exemplary embodiment.

Referring to FIG. 8, the component area CA may include the transmission area TA and pixel groups PG each including at least one auxiliary sub-pixel Pa. The pixel group PG and the transmission area TA may be alternately arranged in the x-direction and the y-direction, and arranged in a lattice form, for example. In this case, the component area CA may include a plurality of pixel groups PG and a plurality of transmission areas TA.

As the non-polarization areas NPLA of the optical functional layer OFL correspond to transmission areas TA, the non-polarization areas NPLA may be provided in plural corresponding to the component area CA. The non-polarization areas NPLA and the auxiliary display areas ADA may be alternately arranged. According to the arrangements of the auxiliary sub-pixels Pa in the component area CA, the non-polarization areas NPLA may be variously arranged, such as being arranged to surround at least some portions of the auxiliary display areas ADA, for example.

Figure 9A:
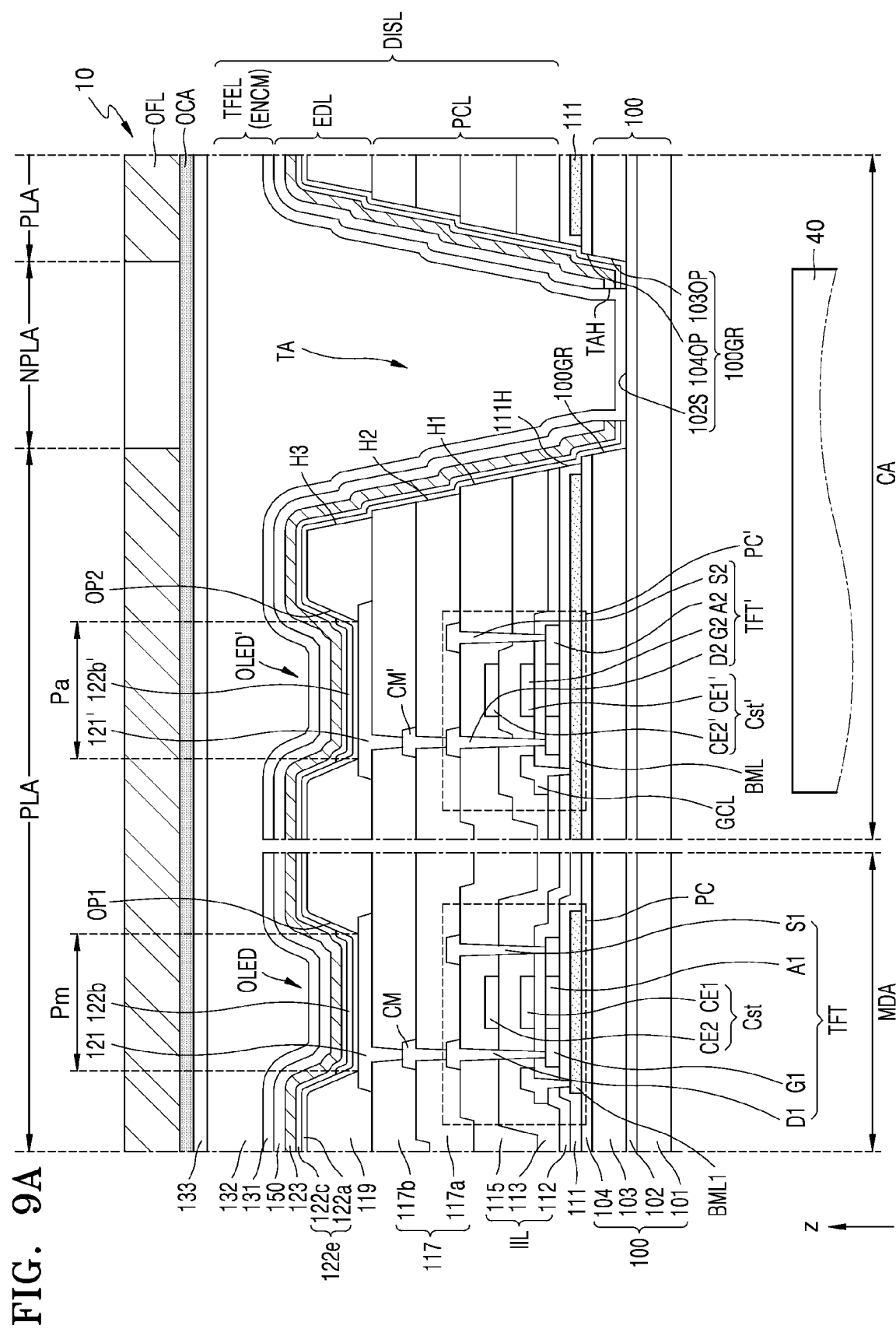
FIG. 9A is a schematic cross-sectional view of a portion of the display panel according to an exemplary embodiment.

FIG. 9A is a schematic cross-sectional view of a portion of the display panel according to an exemplary embodiment. Like reference numerals in FIGS. 7 and 9A denote like elements, and thus, repeated descriptions of substantially the same elements already described above will be omitted. The display panel of FIG. 9A differs from that of FIG. 7 in that the substrate 100 according to the illustrated exemplary embodiment has a groove 100GR corresponding to the transmission area TA, and the planarization layer 117 includes a first planarization layer 117a and a second planarization layer 117b.

Referring to FIG. 9A, the substrate 100 of the display panel may include a first base layer 101, a first inorganic barrier layer 102, a second base layer 103, and a second inorganic barrier layer 104 sequentially stacked one over another. As described above, the first base layer 101 and the second base layer 103 may include polymer resin. The first inorganic barrier layer 102 and the second inorganic barrier layer 104 are barrier layers that prevent the penetration of impurities from the outside. The first inorganic barrier layer 102 and the second inorganic barrier layer 104 may include $SiO_2$, $SiN_x$, and SiON, and may have a single-layer structure or a multilayered structure.

The substrate 100 according to the illustrated exemplary embodiment may include the groove 100GR that corresponds to the transmission area TA. The groove 100GR may be a region remaining after a portion of the substrate 100 is removed in a downward direction (e.g., −z direction). For example, the first base layer 101 and the first inorganic barrier layer 102 may be continuous over the transmission area TA. The second base layer 103 and the second inorganic barrier layer 104 may have openings 103OP and 104OP corresponding to the transmission area TA. The substrate 100 having the above structure may include the groove 100GR. The groove 100GR of the substrate 100 may include the opening 104OP of the second inorganic barrier layer 104, the opening 103OP of the second base layer 103, and an upper surface 102S of the first inorganic barrier layer 102 that is exposed by the openings 103OP and 104OP.

The substrate 100 may include the groove 100GR in various forms. For example, a portion of the upper surface 102S (+z direction) of the first inorganic barrier layer 102 may also be removed, but a bottom surface (−z direction) of the second base layer 103 may be retained instead of being removed. In this manner, a thickness of the substrate 100 in the transmission area TA may be reduced due to the groove 100GR formed on the substrate 100, and thus, the light transmittance of the transmission area TA may be increased significantly. Also, the buffer layer 111 according to the illustrated exemplary embodiment may include a buffer hole 111H corresponding to the transmission area TA.

The circuit layer PCL of the display panel 10 may include the first planarization layer 117a and the second planarization layer 117b. Accordingly, when conductive patterns such as wires may be formed between the first planarization layer 117a and the second planarization layer 117b, high integration may be achieved.

The first planarization layer 117a may cover the pixel circuits PC and PC'. The second planarization layer 117b may be disposed above the first planarization layer 117a and may have a flat upper surface so that the pixel electrodes 121 and 121' are flat. The first planarization layer 117a and the second planarization layer 117b may each include an organic material or an inorganic material, and may have a single-layer structure or a multilayered structure. The first planarization layer 117a and the second planarization layer 117b may each include a general-purpose polymer such as BCB, PI, HMDSO, PMMA or PS, a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, or the like. The first planarization layer 117a and the second planarization layer 117b may include an inorganic insulating material, such as $SiO_2$, $SiN_x$, SiON, $Al_2O_3$, $TiO_2$, $Ta_2O_5$, $HfO_2$, or $ZnO_2$. When the first planarization layer 117a and the second planarization layer 117b are formed, mechano-chemical polishing may be performed on upper surfaces of the first planarization layer 117a and the second planarization layer 117b to provide an flat upper surface after the formation of the first planarization layer 117a and the second planarization layer 117b.

On the second planarization layer 117b, the organic light-emitting diodes OLED and OLED' are disposed. The pixel electrodes 121 and 121' of the organic light-emitting diodes OLED and OLED' may be connected to the pixel circuits PC and PC' by connection electrodes CM and CM' disposed on the planarization layer 117.

The connection electrodes CM and CM' may be disposed between the first planarization layer 117a and the second planarization layer 117b. The connection electrodes CM and CM' may each include a conductive material, such as Mo, Al, Cu, or Ti, and may be a monolayer or multilayers including the above material(s). For example, the connection electrodes CM and CM' may have a multilayered structure of Ti/Al/Ti.

The display panel 10 may include a first metal layer BML1 disposed in the main display area MDA. The first metal layer BML1 may be disposed between the substrate 100 and the main pixel circuit PC, corresponding to the main thin film transistor TFT of the main display area MDA. In an exemplary embodiment, the first metal layer BML1 may be disposed corresponding to part of the main display area MDA. Alternatively, the first metal layer BML1 may be disposed corresponding to the entire main display area MDA. Still alternatively, the first metal layer BML1 may be integrally formed with the bottom metal layer BML in the component area CA. The first metal layer BML1 may receive a constant voltage or signals, and accordingly, damage to the main pixel circuit PC, which may be caused due to the electrostatic discharge, may be prevented.

The first metal layer BML1 may include Al, Pt, Pd, Ag, Mg, Au, Ni, Nd, Ir, Cr, Ca, Mo, Ti, W, and/or Cu. The first metal layer BML1 may be a single layer or multilayers including the above material(s).

The bottom metal layer BML of the component area CA may correspond to the entire component area CA. In this case, the bottom metal layer BML may include a lower hole BMLH overlapping the transmission area TA. In some exemplary embodiments, shapes and sizes of the transmission area TA may be defined according to shapes and sizes of the lower hole BMLH.

On the display element layer EDL of the display panel 10, the thin film encapsulation layer TFEL may be disposed as the encapsulation member ENCM. More particularly, the organic light-emitting diodes OLED and OLED' may be sealed by the thin film encapsulation layer TFEL. The thin film encapsulation layer TFEL may be disposed on an upper layer 150. The thin film encapsulation layer TFEL may prevent the penetration of external moisture or foreign materials into the organic light-emitting diodes OLED and OLED'.

The thin film encapsulation layer TFEL may include at least one inorganic encapsulation layer and at least one organic encapsulation layer. As such, the thin film encapsulation layer TFEL has a structure in which the first inorganic encapsulation layer 131, the organic encapsulation layer 132, and the second inorganic encapsulation layer 133 are stacked, as shown in FIG. 9A. In some exemplary embodiments, however, the number of organic encapsulation layers, the number of inorganic encapsulation layers, and a stack order may be varied.

The first inorganic encapsulation layer 131 and the second inorganic encapsulation layer 133 may include at least one inorganic insulating material selected from the group consisting of $SiO_2$, $SiN_x$, SiON, $Al_2O_3$, $TiO_2$, $Ta_2O_5$, $HfO_2$, or $ZnO_2$, and may be formed by chemical vapor deposition (CVD). The organic encapsulation layer 132 may include a polymer-based material. The polymer-based material may include silicon-based resin, acryl-based resin, epoxy-based resin, PI, polyethylene, or the like.

The first inorganic encapsulation layer 131, the organic encapsulation layer 132, and the second inorganic encapsulation layer 133 may be integrally formed to cover the main display area MDA and the component area CA. Accordingly, the first inorganic encapsulation layer 131, the organic encapsulation layer 132, and the second inorganic encapsulation layer 133 may be disposed in the through hole TAH.

As shown in FIG. 9A, when the substrate 100 includes the groove 100GR corresponding to the transmission area TA, the first inorganic encapsulation layer 131 may be disposed in the groove 100GR of the substrate 100. The first inorganic encapsulation layer 131 may directly contact the upper surface 102S of the first inorganic barrier layer 102 of the substrate 100.

In another exemplary embodiment, the organic encapsulation layer 132 may be integrally formed to cover the main display area MDA and the component area CA, but may not be formed in the transmission area TA. In particular, the organic encapsulation layer 132 may include the opening corresponding to the transmission area TA. In this case, the first inorganic encapsulation layer 131 and the second inorganic encapsulation layer 133 may contact each other in the through hole TAH.

The optical functional layer OFL may be disposed on the thin film encapsulation layer TFEL, and may include the polarization area PLA and the non-polarization area NPLA. The polarization area PLA of the optical functional layer OFL may be disposed to correspond to the auxiliary display area ADA among the main display area MDA and the component area CA. The non-polarization area NPLA of the optical functional layer OFL may correspond to the transmission area TA.

Since the optical functional layer OFL includes the non-polarization area NPLA, the light transmittance of the transmission area TA may be greatly improved. The non-polarization area NPLA may be formed by bleaching part of the optical functional layer OFL that is a polarization film. Accordingly, an upper surface of the non-polarization area NPLA in the optical functional layer OFL may form the same surface as an upper surface of the polarization area PLA. Also, because the non-polarization area NPLA does not polarize light, the non-polarization area NPLA may have greater light transmittance than the polarization area PLA.

As described above, a groove is formed in the substrate 100 to improve the light transmittance of the transmission area TA, or the buffer hole 111H and the first to third holes H1 to H3 are respectively formed in the buffer layer 111, the inorganic insulating layer IIL, the planarization layer 117, and the pixel-defining layer 119, corresponding to the transmission area TA. However, the inventive concepts are not limited thereto.

For example, when the substrate 100 of the display panel 10, the buffer layer 111, the inorganic insulating layer IIL, the planarization layer 117, and the pixel-defining layer 119 each includes a material having the high light transmittance, the buffer hole 111H and the first to third holes H1 to H3 may not be formed according to types of the component 40 (see FIG. 2) disposed in the bottom portion of the component area CA.

FIGS. 9B to 9E are schematic cross-sectional views of part of the display panel according to exemplary embodiments. In FIGS. 9B to 9E, part of the component area of the display panel is each shown in detail.

Figure 9B:
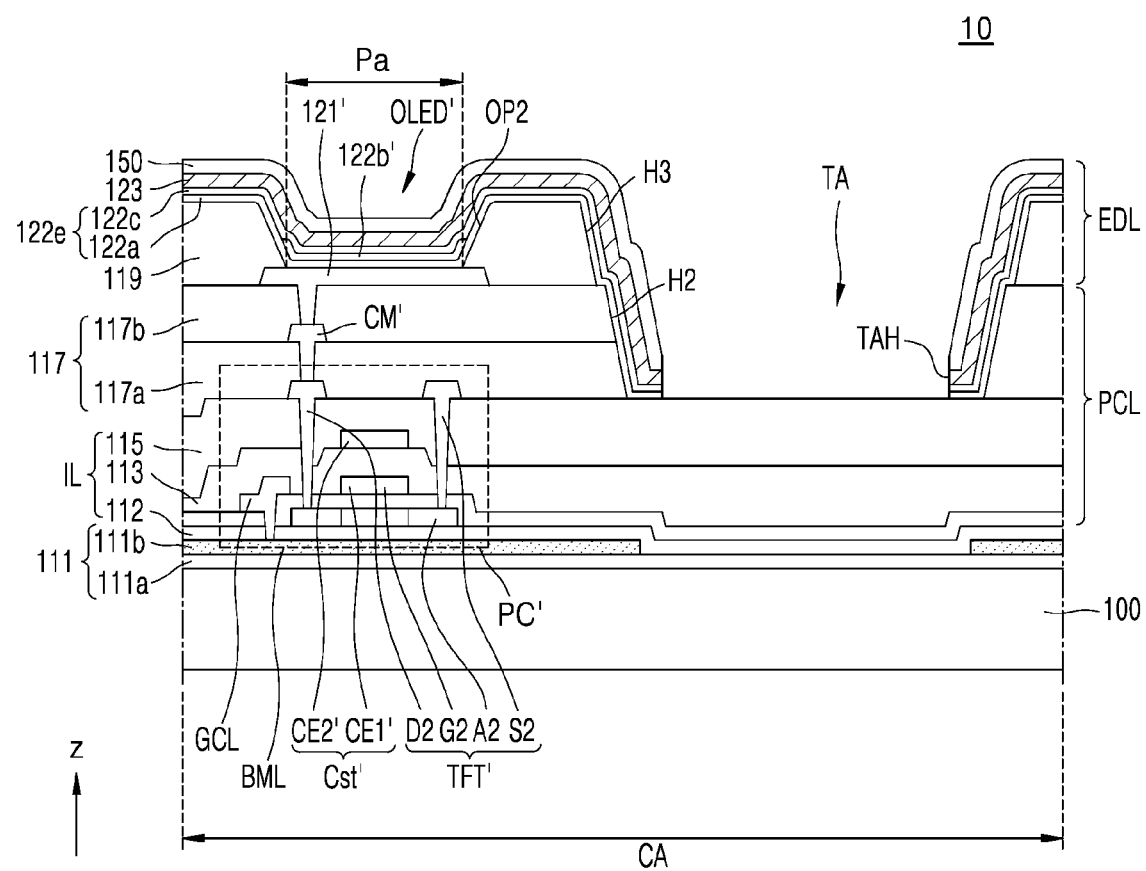
FIGS. 9B, 9C, 9D, and 9E are schematic cross-sectional views of a portion of the display panel according to exemplary embodiments.

Referring to FIG. 9B, the inorganic insulating layer IIL may be continuously arranged corresponding to the transmission area TA. Alternately, at least one of the first gate insulating layer 112, the second gate insulating layer 113, and the interlayer insulating layer 115 of the inorganic insulating layer IIL may be continuously arranged corresponding to the transmission area TA. The planarization layer 117 and the pixel-defining layer 119 may respectively include the second hole H2 and the third hole H3 exposing an upper surface of the inorganic insulating layer IIL, corresponding to the transmission area TA.

Figure 9C:
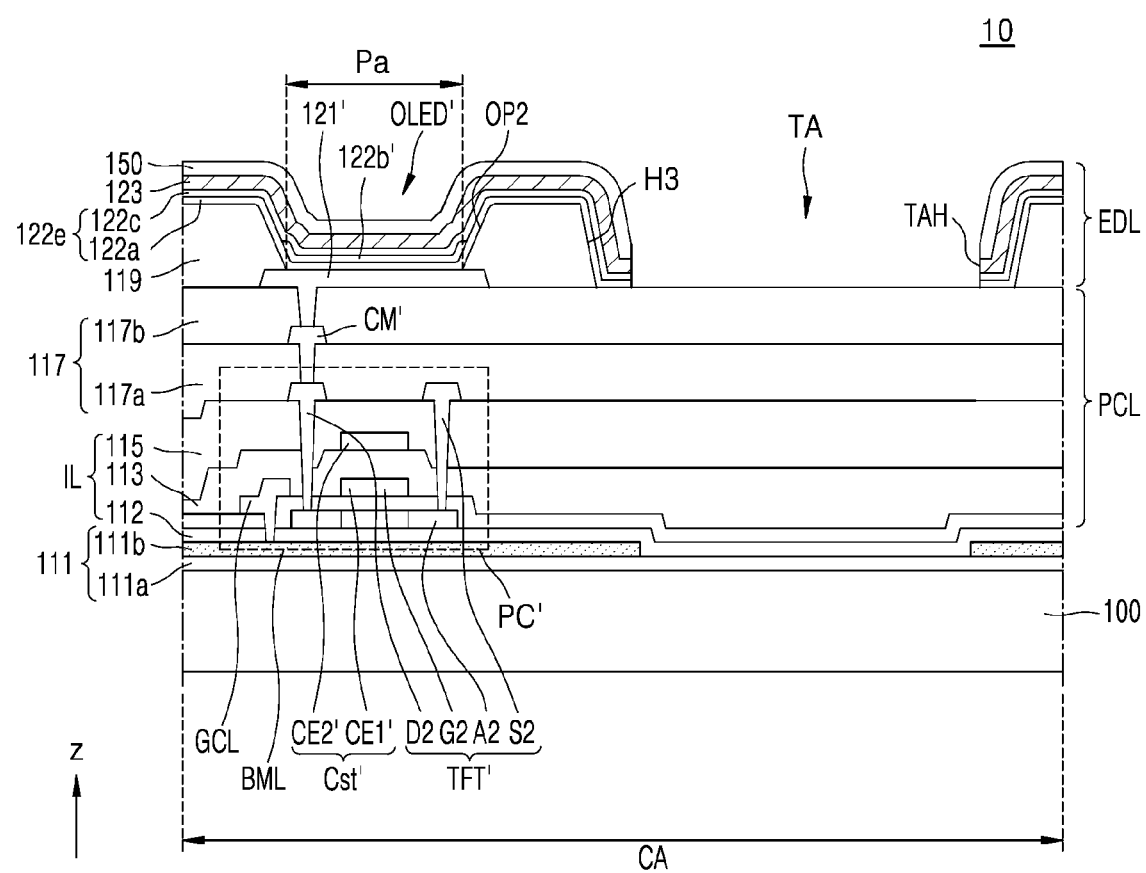

Referring to FIG. 9C, the inorganic insulating layer IIL and the planarization layer 117 may be continuously arranged corresponding to the transmission area TA, and the pixel-defining layer 119 may include the third hole H3 exposing the upper surface of the inorganic insulating layer IIL, corresponding to the transmission area TA. In some exemplary embodiments, the pixel-defining layer 119 may be continuously arranged corresponding to the transmission area TA.

Figure 9D:
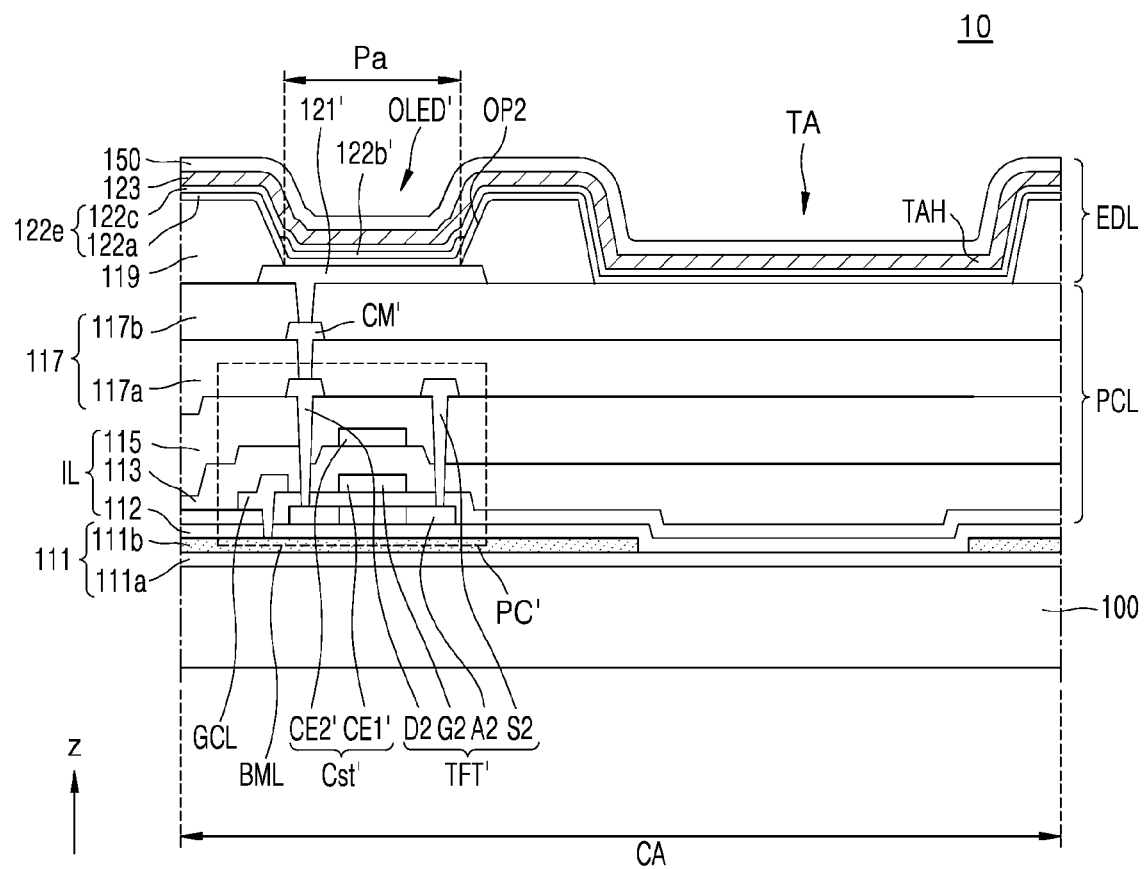

Referring to FIG. 9D, the opposite electrode 123 may be continuously arranged corresponding to the transmission area TA. When the opposite electrode 123 includes a material having high light transmittance, although the opposite electrode 123 does not include a through hole corresponding to the transmission area TA, the transmission area TA may have certain light transmittance.

Figure 9E:
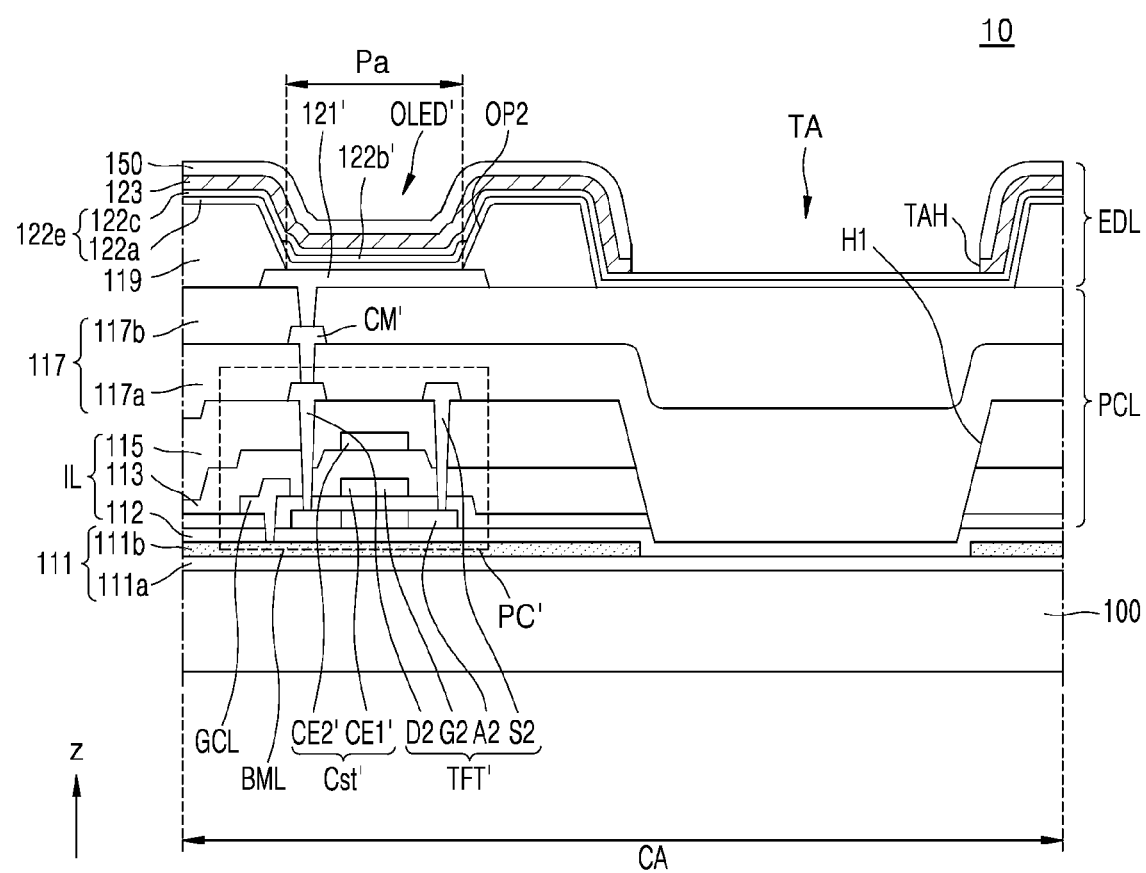

Referring to FIG. 9E, the inorganic insulating layer IIL includes the first hole H1 corresponding to the transmission area TA, and the first planarization layer 117a and the second planarization layer 117b may fill inside the first hole H1. In some exemplary embodiments, the first planarization layer 117a and the second planarization layer 117b may include transparent organic materials having refractive indices similar to those of the substrate 100 and the buffer layer 111. For example, the first planarization layer 117a and the second planarization layer 117b may include siloxane-based organic materials having high light transmittance. The siloxane-based organic materials may include hexamethyldisiloxane, octamethyltrisiloxane, decamethyltetrasiloxane, dodecamethylpentasiloxane, and polydimethylsiloxanes.

Since the planarization layer 117 that has a refractive index similar to the refractive indices of the substrate 100 and the buffer layer 111 is disposed to correspond to the transmission area TA, a loss of the light transmittance, which may otherwise be caused by a difference between the refractive indices, may be reduced.

Figure 10:
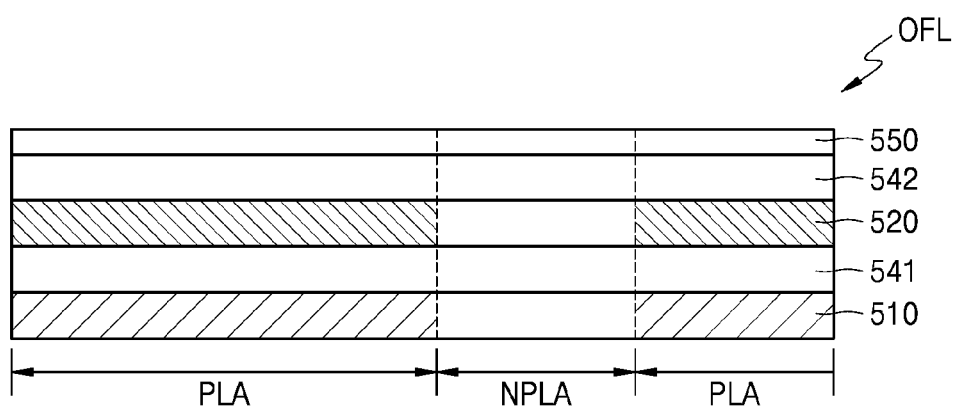
FIG. 10 is a schematic cross-sectional view of an optical functional layer according to an exemplary embodiment.

FIG. 10 is a schematic cross-sectional view of the optical functional layer OFL according to an exemplary embodiment.

Referring to FIG. 10, the optical functional layer OFL may include a polarization layer 520 and a retardation layer 510. The optical functional layer OFL may further include a first protection layer 541, a second protection layer 542, and a hard coating layer 550.

The polarization layer 520 may polarize light, which is incident from the light source, into light in the same direction as a polarization axis. In some exemplary embodiments, the polarization layer 16 may include a polarizer and/or a dichroic dye in a poly vinyl alcohol (PVA) film. The dichroic dye may be iodine molecules and/or dye molecules.

In some exemplary embodiments, the polarization layer 520 may be formed by stretching the PVA film in a direction and soaking the PVA film in an iodine solution and/or a dichroic solution. In this case, the iodine molecules and/or dichroic dye molecules may be arranged in parallel in a stretching direction. Because the iodine molecules and dichroic dye molecules are dichroic, the iodine molecules and dichroic dye molecules may absorb light vibrating in a stretching direction and pass light vibrating in a direction perpendicular to the stretching direction.

The retardation layer 510 may be disposed on one side of the polarization layer 520 and delay the phase of light, which is polarized by passing through the polarization layer 520, by as much as $\lambda/4$ to circularly polarize light. Accordingly, the reflectivity of light may be decreased. The retardation layer 510 may be disposed further away from the light source, as compared to the polarization layer 520. For example, when external light is incident from an upper portion of the polarization layer 520, the retardation layer 510 may be disposed under the polarization layer 520.

On lower and upper surfaces of the polarization layer 520, the first protection layer 541 and the second protection layer 542 may be disposed, respectively. The first protection layer 541 and the second protection layer 542 may function as protection layers reinforcing the mechanical strength of the polarization layer 520 by supporting the polarization layer 520. The first and second protection layers 541 and 542 may include tri-acetyl cellulous (TAC), cyclo olefin polymers, PMMA, or the like.

The hard coating layer 550 may protect a structure of the optical functional layer OFL from external impact, and may be disposed on an uppermost portion of the optical functional layer OFL. The hard coating layer 550 may be scratch-proof and have a strength of about 9H.

In the illustrated exemplary embodiment, the optical functional layer OFL may include the non-polarization layer NPLA. The non-polarization area NPLA may be an area that does not have polarization characteristics by removing part of components of the polarization layer 520 and the retardation layer 510, for example. The non-polarization area NPLA may have higher light transmittance than the polarization area PLA. The non-polarization area NPLA may be formed by bleaching some portions of the optical functional layer OFL.

Figure 11A:
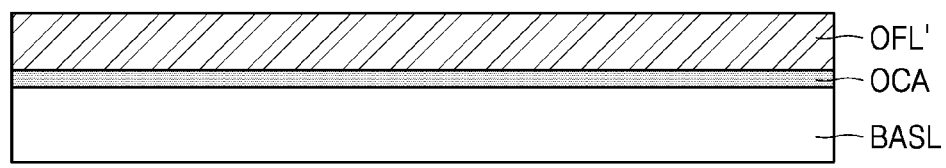
FIGS. 11A, 11B, and 11C are cross-sectional views sequentially showing a method of forming a non-polarization area in the optical functional layer according to an exemplary embodiment.
Figure 11B:
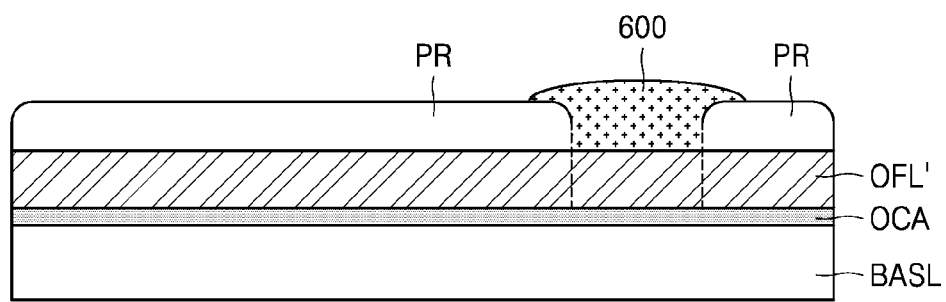
Figure 11C:
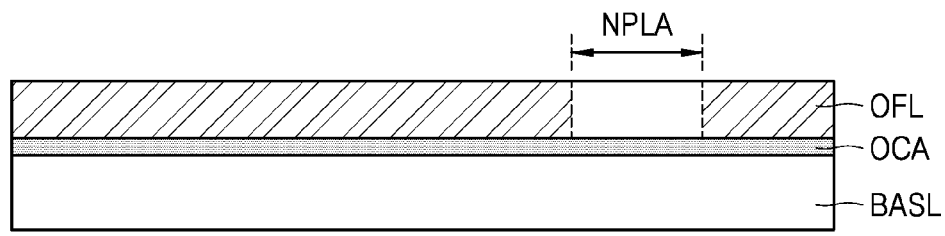

FIGS. 11A to 11C are cross-sectional views sequentially showing a method of forming the non-polarization area NPLA in the optical functional layer OFL according to an exemplary embodiment.

Referring to FIG. 11A, a preliminary optical functional layer OFL' that does not include the non-polarization area NPLA is attached to a base member BASL by using the optical clear adhesive OCA. The base member BASL may be the display panel 10 (see FIG. 2) or the cover window 50 before the optical functional layer OFL is attached.

Referring to FIG. 11B, photoresist PR is formed on the preliminary optical functional layer OFL' overall and is patterned to expose an area of the preliminary optical functional layer OFL' where the non-polarization area NPLA is to be formed through mask processes.

Next, an alkaline solution 600 may contact the area where the non-polarization area NPLA is to be formed. The content of dichroic materials in the exposed area decreases when contacting the alkaline solution 600, and the non-polarization area NPLA may be formed when the content of dichroic materials is decreased. When the polarization layer of the preliminary optical functional layer OFL' includes iodine as a dichroic material, the iodine content in the exposed area decreases by making the exposed area of the preliminary optical functional layer OFL' contact the alkaline solution 600, and accordingly, the non-polarization area may be selectively formed in the exposed area.

In particular, after contacting the exposed area of the preliminary optical functional layer OFL', the alkaline solution 600 penetrates into the exposed area (particularly, the polarization area). An iodine complex included in the polarization layer is reduced by a base included in a base solution and becomes iodine ions. As the iodine complex is reduced into the iodine ions, the polarization performance of the polarization layer exposed by the exposed area is substantially lost, and the non-polarization area is formed in the exposed area. Also, due to the iodine complex, the transmittance of the exposed area is improved.

Basic compounds included in the alkaline solution 600 may be arbitrarily selected. The basic compounds may include hydroxide of alkaline metal such as sodium hydroxide (NaOH), potassium hydroxide (KOH), or lithium hydroxide (LiOH), hydroxide of alkaline earth metal such as calcium hydroxide $CaOH_2$, inorganic alkali metal salt such as sodium carbonate ($Na_2CO_3$), organic alkali metal salt such as sodium acetate ($C_2H_3NaO_2$), aqueous ammonia, or the like. The above basic compounds may be solely used or in a combination of two or more.

A solvent of the alkaline solution 600 may be arbitrarily selected. In particular, the solvent may include water, alcohol such as ethanol or methanol, ether, benzene, chloroform, and a mixed solvent thereof. When using water or alcohol as the solvent, iodine ions may be transferred to the solvent and easily removed.

After the non-polarization area NPLA is formed by making the alkaline solution 600 contact the exposed area of the preliminary optical functional layer OFL', the optical functional layer OFL may be completed by removing the photoresist PR, as shown in FIG. 11C.

In the illustrated exemplary embodiment, the photoresist PR is formed to make the alkaline solution 600 contact a portion to be formed in the non-polarization area NPLA, but the inventive concepts are not limited thereto. For example, in some exemplary embodiments, a portion to be formed in the non-polarization area NPLA is exposed by using a mask instead of using the photoresist PR and the alkaline solution may be sprayed thereon.

Figure 12A:
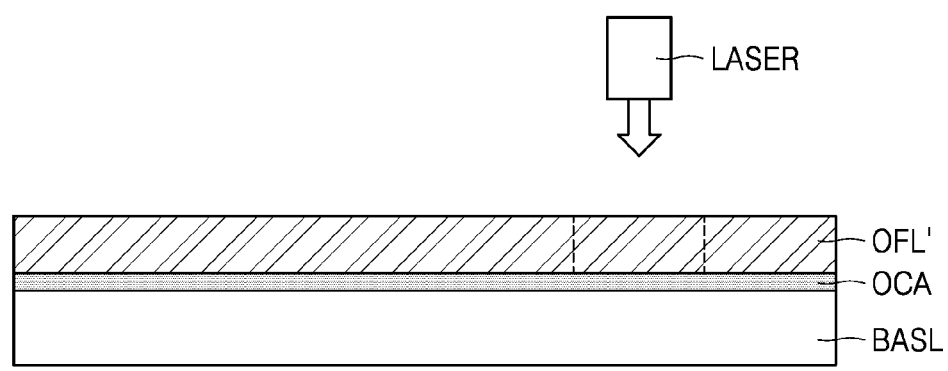
FIGS. 12A and 12B are schematic cross-sectional views of a method of forming a non-polarization area in the optical functional layer according to another exemplary embodiment.
Figure 12B:
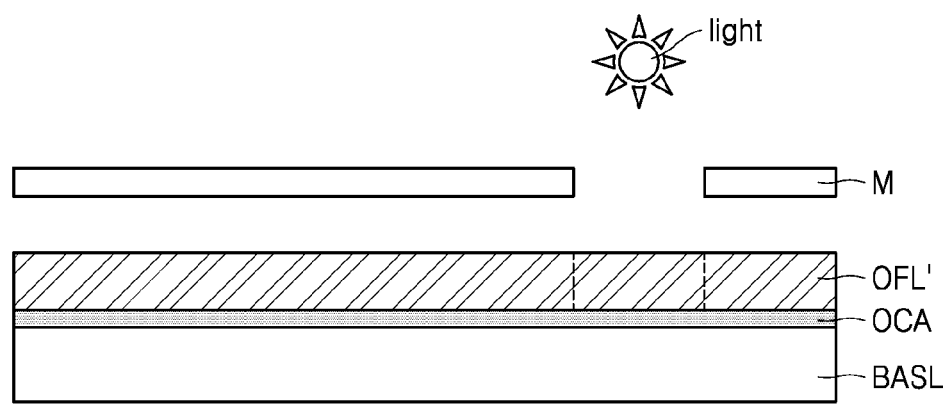

FIGS. 12A and 12B are schematic cross-sectional views of a method of forming the non-polarization area NPLA in the optical functional layer OFL according to another exemplary embodiment.

Light may be used for forming the non-polarization area NPLA in the optical functional layer OFL. For example, as shown in FIG. 12A, after the preliminary optical functional layer OFL' that does not include the non-polarization area NPLA is attached to the base member BASL by the optical clear adhesive OCA, laser beams are irradiated onto the region that is to be the non-polarization area NPLA, thus sublimating the iodine in the polarization layer.

As shown in FIG. 12B, a mask M may be disposed between the light source and the preliminary optical functional layer OFL'. The mask M includes the opening to expose the area that is to be the non-polarization area NPLA. As such, the iodine in the polarization layer, which corresponds to the exposed area of the preliminary optical functional layer OFL', may be sublimated by the light source. Accordingly, as shown in FIG. 11C, the non-polarization area NPLA is formed.

As described above, the display panel according to exemplary embodiments includes the optical functional layer, in which some areas corresponding to the component area is formed as the non-polarization area, and thus, the transmittance of light incident to the component may be increased.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel, comprising:
a main display area and a component area, the component area including an auxiliary display area and a transmission area;
a substrate;
a plurality of main display elements arranged on the substrate in the main display area, and a plurality of main pixel circuits respectively connected to the main display elements;
a plurality of auxiliary display elements arranged on the substrate in the auxiliary display area, and a plurality of auxiliary pixel circuits respectively connected to the auxiliary display elements;
an encapsulation member disposed on the main display elements and the auxiliary display elements;
an optical clear adhesive layer disposed between an optical functional layer and the encapsulation member; and
the optical functional layer disposed on the optical clear adhesive layer, and including a polarization area corresponding to the main display area and the auxiliary display area, and a non-polarization area corresponding to the transmission area,
wherein the optical functional layer continuously extends from the main display area to the auxiliary display area,
wherein a lower surface of the non-polarization area is in direct contact with the optical clear adhesive layer at the transmission area where none of the plurality of main display elements and the plurality of auxiliary display elements are located in a plan view,
wherein the component area overlaps with the polarization area and the non-polarization area,
wherein the polarization area comprises a plurality of polarization areas and the non-polarization area comprises a plurality of non-polarization areas, the plurality of polarization areas and the plurality of non-polarization areas being alternately located along a first direction and a second direction crossing the first direction in the component area, and wherein each of the plurality of polarization areas has a region overlapping with an entirety of at least two of the plurality of auxiliary display elements adjacent to each other in the first direction, and the region has a length in the first direction that is less than or equal to that of an adjacent non-polarization area adjacent thereto in the second direction from among the plurality of non-polarization areas.

2. The display panel of claim 1, wherein, in the component area, the non-polarization area surrounds at least some portions of the auxiliary display area.

3. The display panel of claim 1, wherein the non-polarization area has a greater light transmittance than the polarization area.

4. The display panel of claim 1, wherein an upper surface of the optical functional layer is substantially flat throughout the non-polarization area and the polarization area.

5. The display panel of claim 1, wherein the optical functional layer in the polarization area comprises a material different from the optical functional layer in the non-polarization area.

6. The display panel of claim 1, further comprising an opposite electrode commonly included in the main display elements and the auxiliary display elements,
wherein the opposite electrode includes a through hole corresponding to the transmission area.

7. The display panel of claim 1, wherein:
the substrate comprises a first base layer, a first inorganic barrier layer, a second base layer, and a second inorganic barrier layer sequentially stacked one over another;
the second inorganic barrier layer includes a first opening corresponding to the transmission area, and the second base layer includes a second opening overlapping the first opening; and
the substrate further includes a groove formed by the first opening, the second opening, and an upper surface of the first inorganic barrier layer.

8. The display panel of claim 1, wherein the optical functional layer comprises a polarization layer and a retardation layer.

9. A display device comprising:
a display panel having a main display area and a component area, the component area including an auxiliary display area and a transmission area;
a cover window disposed on the display panel; and
a component disposed under the display panel to correspond to the component area,
wherein the display panel comprises:
a substrate;
a plurality of main display elements arranged on the substrate to correspond to the main display area, and a plurality of main pixel circuits respectively connected to the main display elements;
a plurality of auxiliary display elements arranged on the substrate to correspond to the auxiliary display area, and a plurality of auxiliary pixel circuits respectively connected to the auxiliary display elements;
an encapsulation member disposed on the main display elements and the auxiliary display elements;
an optical clear adhesive layer disposed between an optical functional layer and the encapsulation member; and
the optical functional layer disposed on the optical clear adhesive layer, and including a polarization area corresponding to the main display area and the auxiliary display area, and a non-polarization area corresponding to the transmission area,
wherein the optical functional layer continuously extends from the main display area to the auxiliary display area,
wherein a lower surface of the non-polarization area is in direct contact with the optical clear adhesive layer at the transmission area where none of the plurality of main display elements and the plurality of auxiliary display elements are located in a plan view,
wherein the component area overlaps with the polarization area and the non-polarization area,
wherein the polarization area comprises a plurality of polarization areas and the non-polarization area comprises a plurality of non-polarization areas, the plurality of polarization areas and the plurality of non-polarization areas being alternately located along a first direction and a second direction crossing the first direction in the component area, and
wherein each of the plurality of polarization areas has a region overlapping with an entirety of at least two of the plurality of auxiliary display elements adjacent to each other in the first direction, and the region has a length in the first direction that is less than or equal to that of an adjacent non-polarization area adjacent thereto in the second direction from among the plurality of non-polarization areas.

10. The display device of claim 9, further comprising an additional optical clear adhesive layer disposed between the optical functional layer and the cover window.

11. The display device of claim 9, wherein, in the component area, the non-polarization area surrounds at least some portions of the auxiliary display area.

12. The display device of claim 9, wherein the component overlaps at least some portions of the auxiliary display area.

13. The display device of claim 9, wherein the non-polarization area has a greater light transmittance than the polarization area.

14. The display device of claim 9, wherein an upper surface of the optical functional layer is substantially flat throughout the non-polarization area and the polarization area.

15. The display device of claim 9, wherein the optical functional layer in the polarization area comprises a material different from the optical functional layer in the non-polarization area.

16. The display device of claim 9, wherein the optical functional layer comprises a polarization layer and a retardation layer.

17. The display device of claim 9,
wherein the auxiliary display elements comprise an opposite electrode including a through hole that corresponds to the transmission area.

18. The display device of claim 9, wherein the substrate comprises a groove corresponding to the transmission area.

* * * * *